(12) United States Patent
Shintani et al.

(10) Patent No.: US 8,179,462 B2
(45) Date of Patent: May 15, 2012

(54) IMAGING UNIT

(75) Inventors: Dai Shintani, Osaka (JP); Takanori Yogo, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/000,682

(22) PCT Filed: Oct. 27, 2009

(86) PCT No.: PCT/JP2009/005661
§ 371 (c)(1),
(2), (4) Date: Dec. 22, 2010

(87) PCT Pub. No.: WO2010/050184
PCT Pub. Date: May 6, 2010

(65) Prior Publication Data
US 2011/0102653 A1    May 5, 2011

(30) Foreign Application Priority Data
Oct. 28, 2008    (JP) ................................ 2008-276416

(51) Int. Cl.
H04N 3/14    (2006.01)
G02B 7/28    (2006.01)

(52) U.S. Cl. ........................................ 348/294; 396/111

(58) Field of Classification Search ................ 396/111; 348/272, 311, 360, 294
See application file for complete search history.

(56) References Cited

U.S. PATENT DOCUMENTS

| | | | |
|---|---|---|---|
| 2006/0091290 A1 | 5/2006 | Yoshihara et al. | |
| 2006/0120710 A1 * | 6/2006 | Nagano et al. | 396/111 |
| 2008/0240701 A1 | 10/2008 | Kusaka | |
| 2010/0328503 A1 * | 12/2010 | Shintani et al. | 348/272 |
| 2010/0329656 A1 * | 12/2010 | Shintani | 396/111 |

FOREIGN PATENT DOCUMENTS

| | | |
|---|---|---|
| JP | 2002-027303 A | 1/2002 |
| JP | 2006-128196 A | 5/2006 |
| JP | 2006-154065 A | 6/2006 |
| JP | 2007-135140 A | 5/2007 |
| JP | 2007-163545 A | 6/2007 |
| JP | 2008-242182 A | 10/2008 |

OTHER PUBLICATIONS

International Search Report for corresponding International Application No. PCT/JP2009/005661 dated Dec. 3, 2009.
Form PCT-ISA-237 for corresponding International Application No. PCT/JP2009/005661 dated Dec. 3, 2009.

* cited by examiner

*Primary Examiner* — Clayton E LaBalle
*Assistant Examiner* — Dennis Hancock
(74) *Attorney, Agent, or Firm* — Renner, Otto, Boisselle & Sklar, LLP

(57) ABSTRACT

The present invention relates to an imaging unit including an imaging device for performing photoelectric conversion. There is provided an imaging unit with which the mechanical strength of an imaging device can be ensured while allowing light to pass through the imaging device so as to improve the usability in various operations using the imaging device. An imaging unit (1) includes a substrate (11a), a light-receiving portion (11b) provided on the substrate (11a), an imaging device (10) configured to photoelectrically convert light received by the light-receiving portion (11b) into an electric signal while light is allowed to pass through the imaging device (10), and a glass substrate (19) bonded to the imaging device (10) and allowing light to pass therethrough.

16 Claims, 13 Drawing Sheets

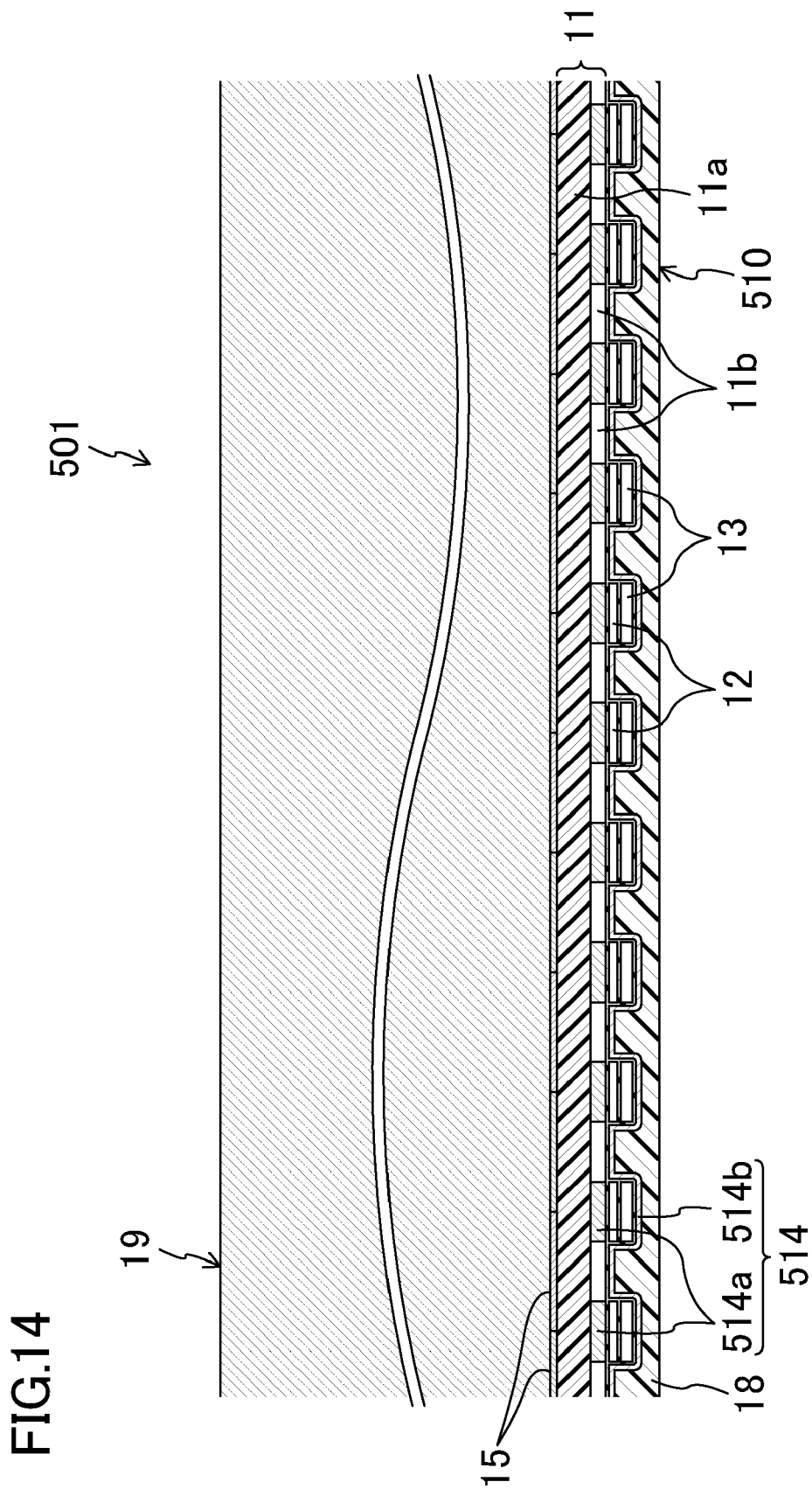

IMAGING UNIT

TECHNICAL FIELD

The present invention relates to an imaging unit including an imaging device for performing photoelectric conversion.

BACKGROUND ART

In recent years, digital cameras have been widespread for converting an object image into an electric signal by using an imaging device such as a CCD (Charge Coupled Device) image sensor or a CMOS (Complementary Metal-Oxide Semiconductor) image sensor, and digitizing and recording the electric signal.

A digital single-lens reflex camera includes a phase difference detection section for detecting the phase difference of the object image, and has a phase difference detection-type AF function of performing autofocus (hereinafter also referred to simply as "AF"). With the phase difference detection-type AF function, since it is possible to detect the direction of defocus and the amount of defocus, it is possible to shorten the amount of time required for moving the focus lens and focus quickly (e.g., Patent Document 1). For guiding light from an object onto the phase difference detection section, a conventional digital single-lens reflex camera includes a movable mirror that can be moved into/out of the optical path from the lens barrel to the imaging device.

A so-called compact digital camera employs an autofocus function by video AF using an imaging device (e.g., Patent Document 2). Thus, a compact digital camera realizes a small size by eliminating the mirror for guiding light from the object to the phase difference detection section. With such a compact digital camera, it is possible to autofocus while exposing the imaging device. That is, various operations using the imaging device, e.g., obtaining an image signal from the object image formed on the imaging device to display it on the image display section provided on the back of the camera or to record it in the recording section, can be performed while performing autofocus. The autofocus function by video AF is advantageous in that the precision is typically higher than phase difference detection-type AF.

Citation List

Patent Document

PATENT DOCUMENT 1: Japanese Published Patent Application No. 2007-163545

PATENT DOCUMENT 2: Japanese Published Patent Application No. 2007-135140

SUMMARY OF THE INVENTION

Technical Problem

However, the direction of defocus cannot be detected instantaneously by video AF as in the digital camera of Patent Document 2. For example, while contrast detection-type AF detects the focus by detecting the contrast peak, the direction of contract peak, i.e., the direction of defocus, cannot be detected unless the focus lens is moved forward/backward from the current position. Therefore, the focus detection takes a long time.

That is, in order to shorten the amount of time required for the focus detection, phase difference detection-type AF is more advantageous. However, in an imaging apparatus employing phase difference detection-type AF such as the digital single-lens reflex camera of Patent Document 1, the movable mirror needs to be moved into the optical path from the lens barrel to the imaging device in order to guide light from the object onto the phase difference detection section. Therefore, various operations using the imaging device cannot be performed while performing phase difference detection-type AF. In order to switch the path of the incident light between a path toward the phase difference detection section and another path toward the imaging device, the movable mirror needs to be moved, and the movement of the movable mirror results in a time lag or noise.

That is, a conventional imaging apparatus performing phase difference detection-type AF has poor usability in terms of various operations using the imaging device.

The present invention has been made in view of this, and has an object to improve the usability in various operations using the imaging device and the phase difference detection using the phase difference detection section.

Solution to the Problem

The present applicant has made in-depth researches in an attempt to solve the above problems, arriving at using light that has passed through the imaging device. That is, by performing phase difference detection-type focus detection using light that has passed through the imaging device, it is possible to eliminate the movable mirror, and it is also possible to perform an operation by the imaging device and the phase difference detection at the same time. Moreover, by allowing light to pass through the imaging device, it is possible to improve the usability not only in performing the phase difference detection but also in performing various operations.

However, in order to allow light to pass through the imaging device, the imaging device needs to be thin, which lowers the mechanical strength of the imaging device. Thus, an object of the present invention is to provide an imaging unit which allows light to pass through an imaging device while ensuring the mechanical strength of the imaging device.

Therefore, in the present invention, an optically transparent substrate is bonded to a substrate of an imaging device so as to reinforce the imaging device. Specifically, an imaging unit of the present invention includes: an imaging device including a semiconductor substrate and a light-receiving portion provided on the semiconductor substrate for photoelectrically converting light received by the light-receiving portion into an electric signal while light is allowed to pass through the imaging device; and an optically transparent substrate bonded to the imaging device, the optically transparent substrate allowing light to pass therethrough.

Advantages of the Invention

According to the present invention, an optically transparent substrate is bonded to an imaging device, whereby the imaging device can be reinforced even if the imaging device is made so thin that light is allowed to pass therethrough. Since the reinforcing substrate is provided as an optically transparent substrate, and therefore the optically transparent substrate can also allow light to pass therethrough, the optically transparent substrate does not hinder light from being incident upon the imaging device or exiting the imaging device.

BRIEF DESCRIPTION OF THE DRAWINGS

FIG. 14 is a cross-sectional view of an imaging device according to Embodiment 2.

DESCRIPTION OF EMBODIMENTS

Embodiments of the present invention will now be described in detail with reference to the drawings.

<<Embodiment 1 of Present Invention>>

A camera including an imaging unit 1 according to Embodiment 1 of the present invention will be described.

Figure 2:
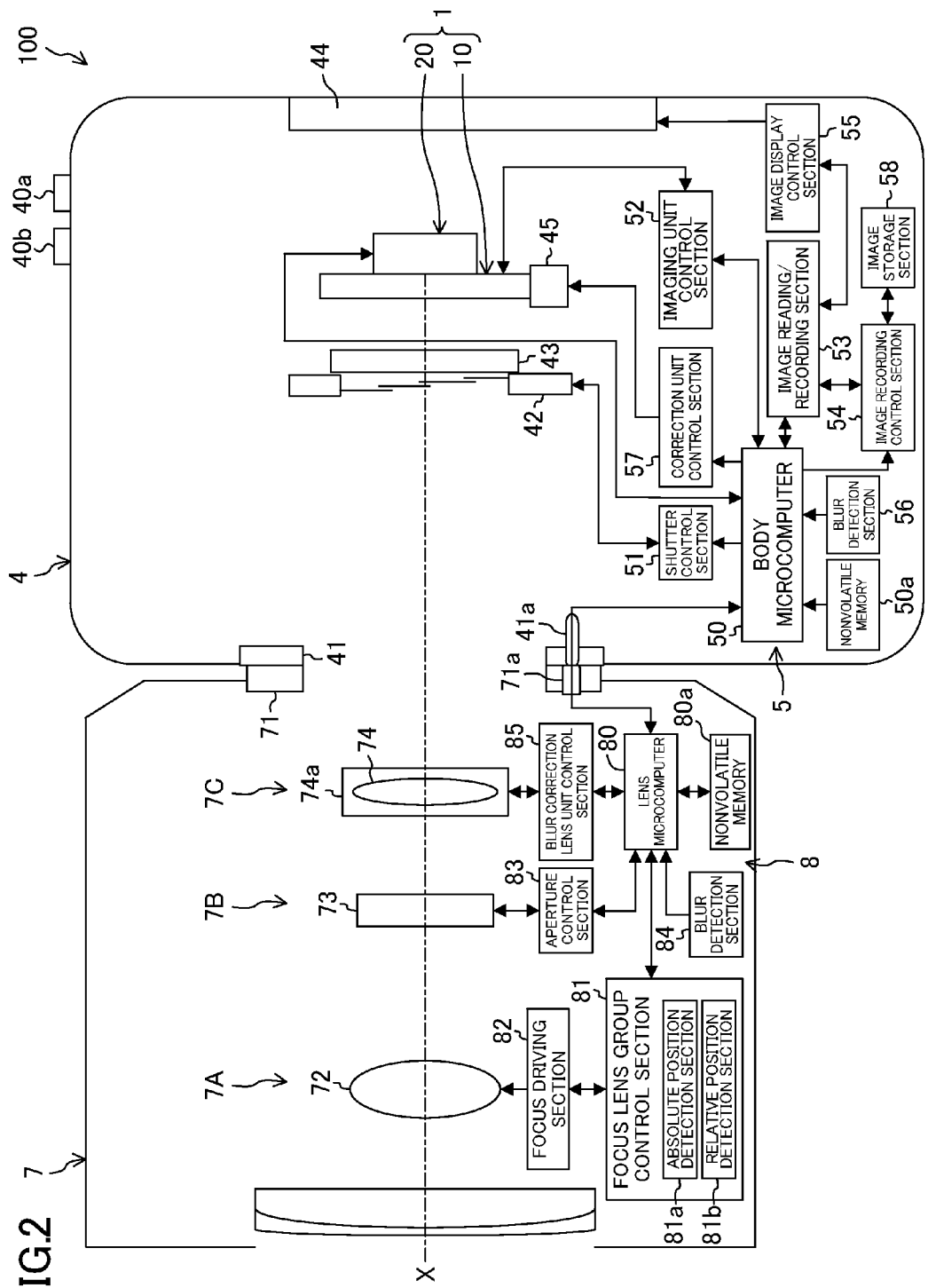
FIG. 2 is a block diagram of a camera.

As shown in FIG. 2, a camera 100 of Embodiment 1 is an interchangeable lens-type single-lens reflex digital camera formed primarily by a camera body 4 responsible for main functions of the camera system, and an interchangeable lens 7 detatchably attached to the camera body 4. The interchangeable lens 7 is attached to a body mount 41 provided on the front surface of the camera body 4. The body mount 41 is provided with an electric segment 41a.

—Configuration of Camera Body—

The camera body 4 includes the imaging unit 1 for obtaining an object image as a shooting image, a shutter unit 42 for adjusting the exposure of the imaging unit 1, an IR-cut/OLPF (Optical Low Pass Filter) 43 for removing infrared light and reducing the moire phenomenon of the object image incident upon the imaging unit 1, an image display section 44, which is an LCD monitor, for displaying a shooting image, a live-view image and various information, and a body control section 5. The camera body 4 forms an imaging apparatus main body.

The camera body 4 includes a power switch 40a for turning ON/OFF the power of the camera system, and a release button 40b operated by the photographer when adjusting the focus and when releasing the shutter.

When the power is turned ON by the power switch 40a, the power is supplied to various sections of the camera body 4 and the interchangeable lens 7.

The release button 40b is a two-stage switch, which can be pressed halfway down for autofocus to be described later, AE, etc., and can be pressed all the way down for releasing the shutter.

The imaging unit 1 converts an object image into an electric signal by photoelectric conversion, the details of which will be described later. The imaging unit 1 can be moved by a blur correcting unit 45 in a plane that is orthogonal to the optical axis X.

The body control section 5 includes a body microcomputer 50, a non-volatile memory 50a, a shutter control section 51 for controlling the operation of the shutter unit 42, an imaging unit control section 52 for controlling the operation of the imaging unit 1 and A/D-converting an electric signal from the imaging unit 1 to output the converted signal to the body microcomputer 50, an image reading/recording section 53 for reading out image data from an image storing section 58, e.g., a card-type recording medium or an internal memory, and recording the image data to the image storing section 58, an image recording control section 54 for controlling the image reading/recording section 53, an image display control section 55 for controlling the display of the image display section 44, a blur detection section 56 for detecting the amount of image blur caused by the shaking of the camera body 4, and a correction unit control section 57 for controlling the blur correcting unit 45. The body control section 5 forms a control section.

The body microcomputer 50 is a control device responsible for a central control of the camera body 4, and controls various sequences. The body microcomputer 50 includes a CPU, a ROM and a RAM, for example. The body microcomputer 50 can realize various functions as the CPU reads programs stored in the ROM.

The body microcomputer 50 receives input signals from the power switch 40a and the release button 40b, and outputs control signals to the shutter control section 51, the imaging unit control section 52, the image reading/recording section 53, the image recording control section 54, the correction unit control section 57, etc., instructing the shutter control section 51, the imaging unit control section 52, the image reading/recording section 53, the image recording control section 54, the correction unit control section 57, etc., to perform their controls. The body microcomputer 50 performs microcomputer-to-microcomputer communications with a lens microcomputer 80 to be described later.

For example, in response to an instruction from the body microcomputer 50, the imaging unit control section 52 A/D-converts an electric signal from the imaging unit 1 and outputs the converted signal to the body microcomputer 50. The body microcomputer 50 performs a predetermined image process on the received electric signal to thereby produce an image signal. Then, the body microcomputer 50 transmits an image signal to the image reading/recording section 53, and instructs the image recording control section 54 to record and display the image so that the image recording control section 54 saves the image signal in the image storing section 58 and transmits the image signal to the image display control section 55. The image display control section 55 controls the image display section 44 based on the transmitted image signal so as to display the image on the image display section 44.

The non-volatile memory 50a stores various information regarding the camera body 4 (unit information). The unit information includes, for example, information regarding the model for identifying the camera body 4 (unit identification information) such as the name of the manufacturer, the date of manufacture, the model number of the camera body 4, and information regarding the version of the software installed on the body microcomputer 50 and firmware updates, information regarding whether the camera body 4 is provided with means for correcting an image blur such as the blur correcting unit 45 and the blur detection section 56, information regarding the detection capability such as the model number of the blur detection section 56 and the sensitivity thereof, the error history, etc. Note that these information may be stored in a memory section in the body microcomputer 50 instead of in the non-volatile memory 50a.

The blur detection section 56 includes an angular velocity sensor for detecting the movement of the camera body 4 caused by the camera shake, etc. The angular velocity sensor outputs a positive or negative angular velocity signal depending on the direction in which the camera body 4 moves, based on the output resulting when the camera body 4 stays still. Note that in the present embodiment, two angular velocity sensors are provided for the detection in two directions, i.e., the yawing direction and the pitching direction. The output angular velocity signal undergoes a filtering operation, an amplification operation, etc., and is converted by an A/D conversion section into a digital signal, which is given to the body microcomputer 50.

—Configuration of Interchangeable Lens—

The interchangeable lens 7 forms an imaging optical system for forming an object image on the imaging unit 1 in the camera body 4, and primarily includes a focus adjustment section 7A for adjusting the focus, an aperture adjustment section 7B for adjusting the aperture, a lens image blur correction section 7C for correcting the image blur by adjusting the optical path, and a lens control section 8 for controlling the operation of the interchangeable lens 7.

The interchangeable lens 7 is attached to the body mount 41 of the camera body 4 with a lens mount 71 therebetween. The lens mount 71 includes an electric segment 71a to be electrically connected with the electric segment 41a of the body mount 41 when the interchangeable lens 7 is attached to the camera body 4.

The focus adjustment section 7A is formed by a focus lens group 72 for adjusting the focus. The focus lens group 72 can be moved in the optical axis X over a section from the closest focus position to the infinite focus position, which are determined as standard specifications of the interchangeable lens 7. In the case of a contrast detection-type focus position detection to be described later, it is necessary that the focus lens group 72 can be moved forward and backward in the optical axis X from the focus position, and therefore there is a lens shift margin section in which the focus lens group 72 can be moved forward and backward in the optical axis X beyond the above-described section from the closest focus position to the infinite focus position. Note that the focus lens group 72 does not always need to include a plurality of lenses, and may include a single lens.

The aperture adjustment section 7B is formed by a stop portion 73 for adjusting the aperture to be stopped down or opened up. The stop portion 73 forms a light amount adjustment section.

The lens image blur correction section 7C includes a blur correcting lens 74, and a blur correction lens driving section 74a for moving the blur correcting lens 74 in a plane that is orthogonal to the optical axis X.

The lens control section 8 includes the lens microcomputer 80, a non-volatile memory 80a, a focus lens group control section 81 for controlling the operation of the focus lens group 72, a focus driving section 82 for receiving a control signal from the focus lens group control section 81 to drive the focus lens group 72, a stop control section 83 for controlling the operation of the stop portion 73, a blur detection section 84 for detecting the blur of the interchangeable lens 7, and a blur correction lens unit control section 85 for controlling the blur correction lens driving section 74a.

The lens microcomputer 80 is a control device responsible for a central control of the interchangeable lens 7, and is connected to various sections provided in the interchangeable lens 7. Specifically, the lens microcomputer 80 includes a CPU, a ROM and a RAM, and can realize various functions as the CPU reads programs stored in the ROM. For example, the lens microcomputer 80 has a function of setting the lens image blur correcting devices (the blur correction lens driving section 74a, etc.) to a correction-enabled state or a correction-disabled state based on the signal from the body microcomputer 50. The body microcomputer 50 and the lens microcomputer 80 are electrically connected together via the contact between the electric segment 71a provided on the lens mount 71 and the electric segment 41a provided on the body mount 41 so that information can be exchanged therebetween.

The non-volatile memory 80a stores various information (lens information) regarding the interchangeable lens 7. The lens information includes, for example, information regarding the model for identifying the interchangeable lens 7 (lens identification information) such as the name of the manufacturer, the date of manufacture, the model number of the interchangeable lens 7, and information regarding the version of the software installed on the lens microcomputer 80 and firmware updates, information regarding whether the interchangeable lens 7 is provided with means for correcting an image blur such as the blur correction lens driving section 74a and the blur detection section 84. If the interchangeable lens 7 is provided with means for correcting the image blur, the lens information includes information regarding the detection capability such as the model number of the blur detection section 84 and the sensitivity thereof, information regarding the correction capability such as the model number of the blur correction lens driving section 74a and the maximum correctable angle (lens-side correction capability information), the version of the software for performing the image blur correction, etc. Moreover, the lens information also includes information regarding the power consumption required for driving the blur correction lens driving section 74a (lens-side power consumption information), and information regarding the driving scheme of the blur correction lens driving section 74a (lens-side driving scheme information). Note that the non-volatile memory 80a can store information transmitted from the body microcomputer 50. Note that these information may be stored in the memory section in the lens microcomputer 80 instead of in the non-volatile memory 80a.

The focus lens group control section 81 includes an absolute position detection section 81a for detecting the absolute position of the focus lens group 72 in the optical axis direction, and a relative position detection section 81b for detecting the relative position of the focus lens group 72 in the optical axis direction. The absolute position detection section 81a detects the absolute position of the focus lens group 72 in the casing of the interchangeable lens 7. For example, the absolute position detection section 81a is formed by a several-bit contact-type encoder substrate and a brush, and is configured so that the absolute position can be detected. Although the relative position detection section 81b cannot, by itself, detect the absolute position of the focus lens group 72, it can detect the direction of movement of the focus lens group 72, and it uses a two-phase encoder, for example. As two-phase encoders, two of those that alternately output binary signals with an equal pitch, such as rotary pulse encoders, MR elements and Hall devices, depending on the position in the optical axis direction of the focus lens group 72 are provided so that the phases of the pitches thereof are shifted from each other. The lens microcomputer 80 calculates the relative position of the focus lens group 72 in the optical axis direction based on the output from the relative position detection section 81b.

The blur detection section 84 includes an angular velocity sensor for detecting the movement of the interchangeable lens 7 caused by camera shake, etc. The angular velocity sensor outputs a positive or negative angular velocity signal depending on the direction in which the interchangeable lens 7 moves, based on the output resulting when the interchangeable lens 7 stays still. Note that in the present embodiment, two angular velocity sensors are provided for the detection in two directions, i.e., the yawing direction and the pitching direction. The output angular velocity signal undergoes a filtering operation, an amplification operation, etc., and is converted by an A/D conversion section into a digital signal, which is given to the lens microcomputer 80.

The blur correction lens unit control section 85 includes a movement amount detection section (not shown). The movement amount detection section is a detection section for detecting the actual amount of movement of the blur correcting lens 74. The blur correction lens unit control section 85 feedback-controls the blur correcting lens 74 based on the output from the movement amount detection section.

Note that while the camera body 4 and the interchangeable lens 7 are both provided with the blur detection sections 56 and 84 and the blur correcting devices 45 and 74a, either the camera body 4 or the interchangeable lens 7 may be provided with a blur detection section and a blur correcting device, and neither of them may be provided with a blur detection section and a blur correcting device (in such a case, the above-described blur correction-related sequence can be omitted).

—Configuration of Imaging Unit—

Figure 3:
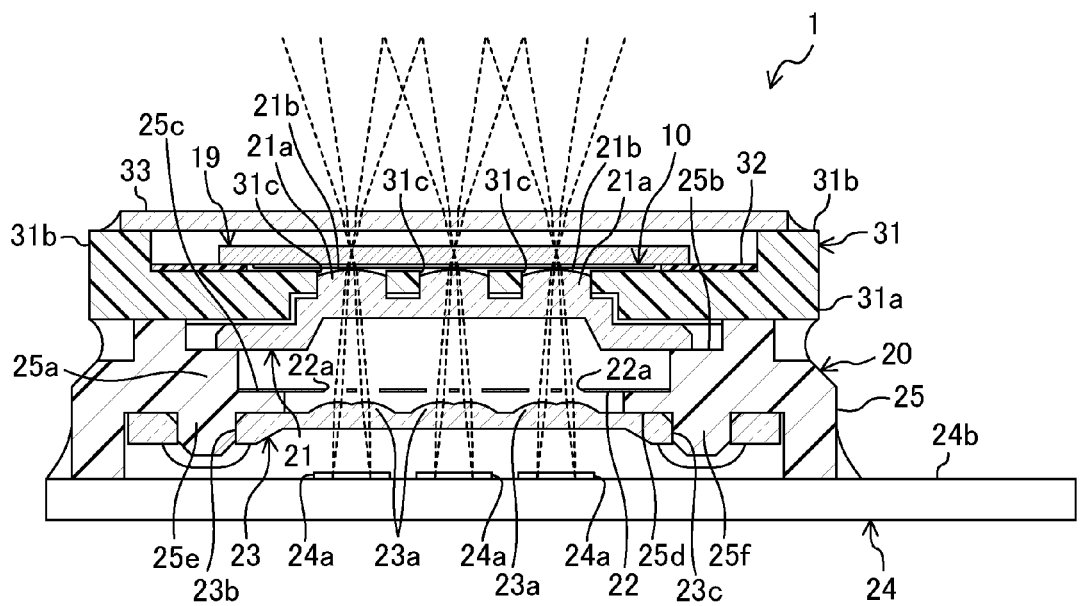
FIG. 3 is a cross-sectional view of an imaging unit.

As shown in FIG. 3, the imaging unit 1 includes an imaging device 10 for converting an object image into an electric signal, a glass substrate 19 bonded to the imaging device 10, a package 31 for holding the imaging device 10, and a phase difference detection unit 20 for performing phase difference detection-type focus detection.

Figure 1:
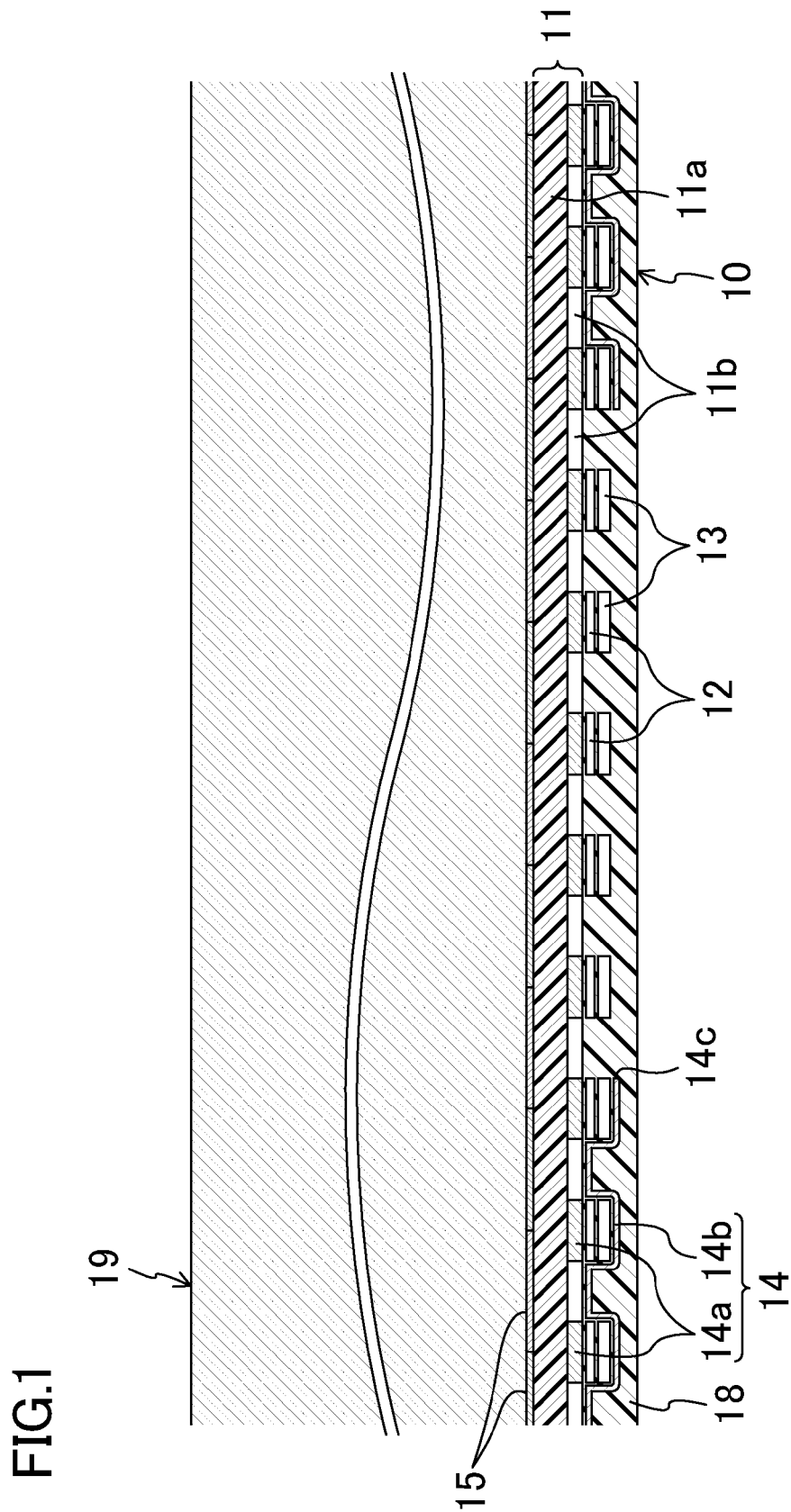
FIG. 1 is a cross-sectional view of an imaging device according to Embodiment 1.

The imaging device 10 is a back side-illuminated interline CCD image sensor, and includes a photoelectric conversion section 11 formed by a semiconductor material, vertical registers 12, transfer paths 13, masks 14, and color filters 15, as shown in FIG. 1.

The photoelectric conversion section 11 includes a substrate 11a, and a plurality of light-receiving portions (also referred to as "pixels") 11b, 11b, . . . , arranged on the substrate 11a.

The substrate 11a is an Si (silicon)-based semiconductor substrate. Specifically, the substrate 11a is formed by an Si single crystal substrate or an SOI (Silicon On Insulator wafer). Particularly, an SOI substrate has a sandwich structure of an Si thin film and an $SiO_2$ thin film, and the reaction can be stopped at the $SiO_2$ layer in an etching process, or the like, which is advantageous for stable substrate processing.

The light-receiving portion 11b is formed by a photodiode, and absorbs light and generates electrical charge. The light-receiving portions 11b, 11b, . . . , are each provided in one of minute square pixel regions arranged in a matrix pattern on the surface of the substrate 11a (the lower surface in FIG. 1) (see FIG. 4).

As described above, the imaging device 10 is a back side-illuminated device, in which light from the object is incident upon a surface (hereinafter referred to also as the "back surface") of the substrate 11a that is opposite to another surface (hereinafter referred to also as "front surface") on which the light-receiving portions 11b, 11b, . . . , are provided.

The vertical register 12 is provided on the front surface of the substrate 11a for each light-receiving portion 11b, and serves to temporarily store the electrical charge stored in the light-receiving portion 11b. That is, the electrical charge stored in the light-receiving portion 11b is transferred to the vertical register 12. The electrical charge transferred to the vertical register 12 is transferred to a horizontal register (not shown) via the transfer path 13, and is sent to an amplifier (not shown). The electrical charge sent to the amplifier is amplified and taken out as an electric signal.

The mask 14 includes an incident-side mask 14a provided on the front surface of the substrate 11a, and an exit-side mask 14b provided so as to cover the light-receiving portion 11b, the vertical register 12 and the transfer path 13 from the opposite side to the substrate 11a. The incident-side mask 14a is provided between the light-receiving portions 11b and 11b on the front surface of the substrate 11a. The vertical register 12 and the transfer path 13 are provided so as to overlap the incident-side mask 14a. Thus, the incident-side mask 14a prevents light having passed through the substrate 11a from being incident upon the vertical register 12 and the transfer path 13. The exit-side mask 14b reflects light, which has passed through the light-receiving portions 11b, 11b, . . . , without being absorbed by the light-receiving portions 11b, 11b, . . . , so that the light is again incident upon the light-receiving portions 11b, 11b, . . . . The exit-side mask 14b includes a plurality of through holes 14c (only one shown in FIG. 1) for allowing light which has passed through the light-receiving portion 11b to exit to the back surface side of the imaging device 10 (the opposite side to the glass substrate 19 in the present embodiment). Note that the exit-side mask 14b may be omitted.

A protection layer 18 formed by an optically transparent resin is provided on the front surface of the substrate 11a so as to cover the light-receiving portion 11b, the vertical register 12, the transfer path 13 and the mask 14.

Figure 4:
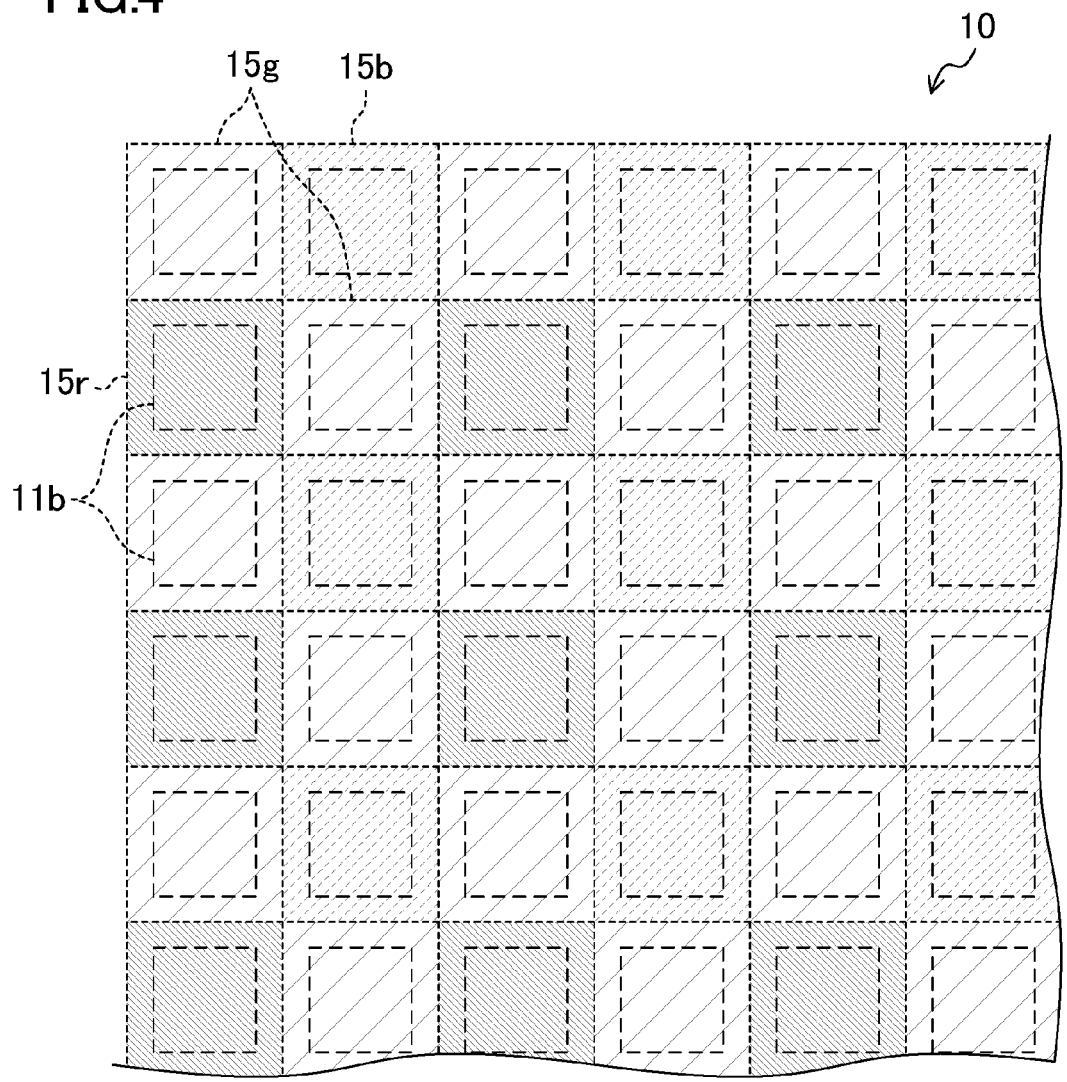
FIG. 4 is a plan view of an imaging device.

The color filter 15 is provided on the back surface side of the substrate 11a for each of minute square pixel regions corresponding to the light-receiving portion 11b. The color filter 15 allows only a particular color to pass therethrough, and is a thin-film interference filter formed by a dielectric. The present embodiment employs a so-called Bayer-type primary color filter as shown in FIG. 4. That is, the imaging device 10 includes repeated units, each including four adjacent color filters 15, 15, . . . , (or four pixel regions) arranged in a 2-by-2 array, wherein each repeated unit includes two green color filters (i.e., color filters having a higher transmittance for a visible wavelength range for green than for visible wavelength ranges for other colors) 15g arranged at one of two pairs of opposing corners, with a red color filter (i.e., a color filter having a higher transmittance for a visible wavelength range for red than for visible wavelength ranges for other colors) 15r and a blue color filter (i.e., a color filter having a higher transmittance for a visible wavelength range for blue than for visible wavelength ranges for other colors) 15b arranged at the other pair of opposing corners. As a whole, the green color filters 15g, 15g, . . . , are arranged at every other positions in the vertical direction and in the horizontal direction. Note that the color filters 15 may be complementary color-type filters each allowing one of colors CyMYG to pass therethrough. The color filter 15 is vapor-deposited on the junction surface of the glass substrate 19 on which the imaging device 10 is bonded.

The glass substrate 19 is formed by a borosilicate glass substrate. The glass substrate 19 corresponds to an optically transparent substrate. The glass substrate 19 is anodically-bonded to the substrate 11a. Here, since borosilicate glass contains a lot of mobile ions, if the glass substrate 19 is formed by borosilicate glass, it can be anodically-bonded to the substrate 11a. While the color filter 15 is vapor-deposited on the surface of the glass substrate 19 that is bonded to the substrate 11a as described above, the glass substrate 19 can be anodically-bonded to the substrate 11a since the color filter 15 is a dielectric.

Note that the material of the glass substrate 19 may be, for example, Pyrex (registered trademark) from Corning Incorporated or Tempax/Duran from Schott AG. The bond between the glass substrate 19 and the substrate 11a is not limited to an anodic bond, but may be a bond with an adhesive, etc.

Here, the substrate 11a anodically-bonded to the glass substrate 19 may be obtained by anodic-bonding the substrate 11a which has been polished to a desired thickness (e.g., 1-5 µm) to the glass substrate 19, or by anodic-bonding the substrate 11a which is thicker than the desired thickness and then polishing the substrate 11a to the desired thickness by etching, etc. In a case where the substrate 11a which is thicker than the desired thickness is used, the anodically-bonded substrate 11a is subjected to a heat treatment so that an $SiO_2$ layer is formed on the surface of the substrate 11a that is opposite to the glass substrate 19. Then, by dissolving only the $SiO_2$ layer with hydrofluoric acid, a thin (e.g., 1-2 µm) Si layer is formed, and the light-receiving portion 11b, the vertical register 12, the transfer path 13, etc., are formed on the Si layer by a semiconductor process.

Light is incident upon the imaging device 10 having such a configuration from the side of the glass substrate 19. Specifically, light which has passed through the glass substrate 19 is incident upon each color filter 15r, 15g, 15b, and only light of the color corresponding to the color filter 15 passes through the color filter 15 to be incident upon the back surface of the substrate 11a. Since the substrate 11a is very thin (i.e., since it is formed to such a thickness that light passes through the substrate 11a), light incident upon the substrate 11a passes through the substrate 11a to reach the light-receiving portions 11b, 11b, . . . , arranged on the front surface of the substrate 11a. Here, since the incident-side masks 14a are provided in areas of the front surface of the substrate 11a where the light-receiving portions 11b, 11b, . . . , are absent, no light is incident upon the vertical register 12 or the transfer path 13. Since the light-receiving portions 11b, 11b, . . . , are each opened across the entire surface thereof toward the side from which light is incident (the side of the substrate 11a), unlike an imaging device 410 of Embodiment 2 to be described later, the quantum yield is very high. Each light-receiving portion 11b absorbs light to generate electrical charge. Here, since the exit-side mask 14b is provided on one side of the light-receiving portion 11b that is opposite to the substrate 11a, light that has passed through the light-receiving portion 11b without being absorbed by the light-receiving portion 11b is reflected by the exit-side mask 14b, and the light is again incident upon the light-receiving portion 11b. This further improves the quantum yield. The electrical charge generated by each light-receiving portion 11b is sent to the amplifier via the vertical register 12 and the transfer path 13, and is output as an electric signal. Since light of a particular color which has passed through one of the color filters 15r, 15g and 15b is incident upon each of the light-receiving portions 11b, 11b, . . . , the amount of received light of the color corresponding to the color filter 15 is obtained as an output from the light-receiving portion 11b.

Thus, the imaging device 10 performs photoelectric conversion by the light-receiving portions 11b, 11b, . . . , across the entire imaging surface, thereby converting an object image formed on the imaging surface into an electric signal.

The imaging device 10 having such a configuration is held by the package 31 (see FIG. 3). The package 31 forms a holding section.

Specifically, the package 31 includes a flat plate-shaped bottom plate 31a, a circuit substrate 32 provided thereon, and side walls 31b, 31b, . . . , along the four sides thereof. The imaging device 10 is mounted on the circuit substrate 32 while being surrounded from four sides by the side wall 31b, 31b, . . . .

Figure 5:
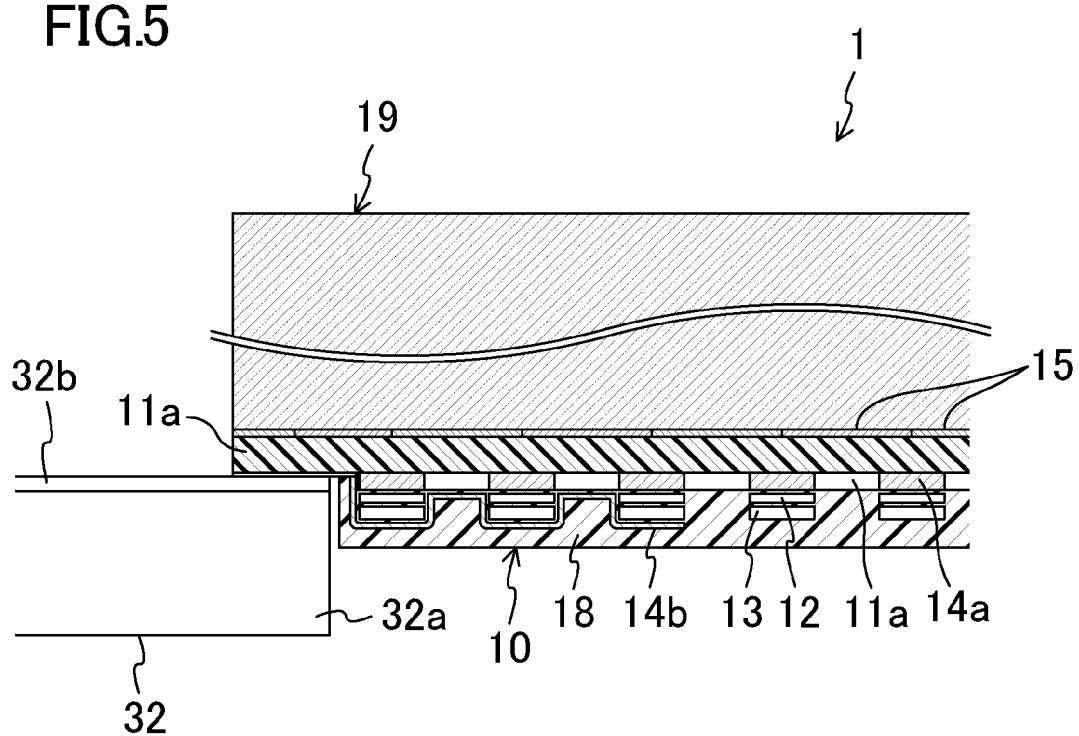
FIG. 5 is an enlarged cross-sectional view showing a joint portion between an imaging device and a package.

Specifically, in the peripheral portion of the substrate 11a of the imaging device 10, the light-receiving portion 11b, the vertical register 12, the transfer path 13, the mask 14, the protection layer 18, etc., are absent, with an interconnect which enables electrical connection with the transfer path 13, the vertical register 12, etc., exposed thereon, as shown in FIG. 5.

On the other hand, the circuit substrate 32 includes a substrate base 32a, and a circuit pattern 32b provided on the front surface (the surface closer to the object) of the substrate base 32a and located so as to face the interconnect of the substrate 11a of the imaging device 10. Then, the peripheral portion of the substrate 11a of the imaging device 10 is laid over the circuit substrate 32 from the object side, and they are bonded together through thermal fusion, thereby electrically connecting the interconnect of the substrate 11a of the imaging device 10 with the circuit pattern 32b.

A cover glass 33 is attached at the tip of the side walls 31b, 31b, . . . , of the package 31 so as to cover the imaging surface (back surface) of the imaging device 10. The cover glass 33 protects the imaging surface of the imaging device 10 from dust, etc.

An equal number of (three in the present embodiment) openings 31c, 31c, . . . , to the number of the through holes 14c, 14c, . . . , of the exit-side mask 14b of the imaging device 10 are formed running through the bottom plate 31a of the package 31 at positions corresponding to the through holes 14c, 14c, . . . . With the openings 31c, 31c, . . . , light which has passed through the imaging device 10 reaches the phase difference detection unit 20 to be described later.

Note that it is not always necessary that the openings 31c are formed running through the bottom plate 31a of the package 31. That is, transparent portions or semi-transparent portions may be formed, for example, in the bottom plate 31a, as long as light which has passed through the imaging device 10 reaches the phase difference detection unit 20.

The phase difference detection unit 20 is provided on the back surface side (the side opposite to the object) of the imaging device 10 for receiving transmitted light from the imaging device 10 to perform phase difference detection-type focus detection. Specifically, the phase difference detection unit 20 converts the received transmitted light into an electric signal for range finding. The phase difference detection unit 20 forms a phase difference detection section.

Figure 6:
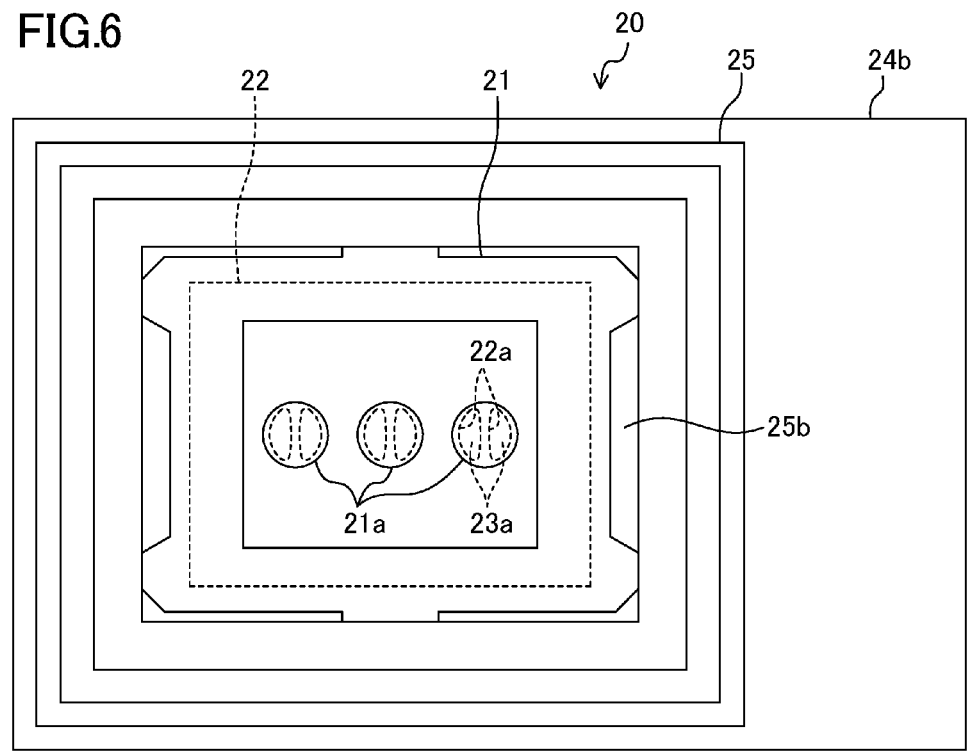
FIG. 6 is a plan view of a phase detection unit.

As shown in FIGS. 3 and 6, the phase difference detection unit 20 includes a condenser lens unit 21, a mask member 22, a separator lens unit 23, a line sensor unit 24, and a module frame 25 for the attachment of the condenser lens unit 21, the mask member 22, the separator lens unit 23 and the line sensor unit 24. The condenser lens unit 21, the mask member 22, the separator lens unit 23 and the line sensor unit 24 are arranged in this order from the side of the imaging device 10 in the thickness direction of the imaging device 10.

The condenser lens unit 21 is obtained by making a plurality of condenser lenses 21a, 21a, . . . , into a single unit. There are an equal number of condenser lenses 21a, 21a, . . . , to the number of the through holes 14c, 14c, . . . , of the exit-side mask 14b. Each condenser lens 21a, a lens for condensing the incident light, condenses light that has passed through the imaging device 10 and started to diverge so as to guide the light onto a separator lens 23a, to be described later, of the separator lens unit 23. Each condenser lens 21a has a convex-shaped incident surface 21b and is shaped in a cylindrical shape around the incident surface 21b.

With the provision of the condenser lens 21a, the light incident upon the separator lens 23a is raised (the angle of incidence is decreased), and it is therefore possible to reduce the aberration of the separator lens 23a and to decrease the object image interval on a line sensor 24a to be described later. As a result, it is possible to reduce the sizes of the separator lens 23a and the line sensor 24a. If the focus position of the object image from the imaging optical system greatly diverges from the imaging unit 1 (specifically, if it greatly diverges from the imaging device 10 of the imaging unit 1), the contrast of the image decreases significantly. In the present embodiment, the decrease in contrast is reduced because of the size-reduction effect by the condenser lens 21*a* and the separator lens 23*a*, and to increase the focus detection range. Note that the condenser lens unit 21 may be absent in cases where a high-precision phase difference detection near the focus position is realized, the sizes of the separator lens 23*a*, the line sensor 24*a*, etc., have some margin, for example.

The mask member 22 is arranged between the condenser lens unit 21 and the separator lens unit 23. The mask member 22 includes two mask openings 22*a* and 22*a* at each position corresponding to the separator lens 23*a*. That is, the mask member 22 divides the lens surface of the separator lens 23*a* into two areas, thus allowing only the two areas to be exposed to the side of the condenser lens 21*a*. That is, the mask member 22 performs pupil-division to split light which has been condensed by the condenser lens 21*a* into two beams, which are incident upon the separator lens 23*a*. With the mask member 22, it is possible to prevent detrimental light from one separator lens 23*a* from being incident upon another, adjacent separator lens 23*a*. Note that the mask member 22 is optional.

The separator lens unit 23 includes a plurality of separator lenses 23*a*, 23*a*, . . . , made into a single unit. As with the condenser lenses 21*a*, 21*a*, . . . , there are an equal number of separator lenses 23*a*, 23*a*, . . . , to the number of the through holes 14*c*, 14*c*, . . . , of the exit-side mask 14*b*. With each separator lens 23*a*, two beams which have passed through the mask member 22 to be incident upon the separator lens 23*a* are formed as two identical object images on the line sensor 24*a*.

The line sensor unit 24 includes a plurality of line sensors 24*a*, 24*a*, . . . , and a base portion 24*b* on which the line sensors 24*a*, 24*a*, . . . , are placed. As with the condenser lenses 21*a*, 21*a*, . . . , there are an equal number of line sensors 24*a*, 24*a*, . . . , to the number of the through holes 14*c*, 14*c*, . . . , of the exit-side mask 14*b*. Each line sensor 24*a* receives an image formed on the imaging surface and converts the received image into an electric signal. That is, it is possible to detect the interval between two object images based on the output from the line sensor 24*a*, and it is possible, based on the interval, to obtain the amount of shift of the focal point (i.e., the amount of defocus (Df amount)) of the object image formed on the imaging device 10 and to obtain the direction toward which the focal point is off (i.e., the direction of defocus) (hereinafter the Df amount, the direction of defocus, etc., will also be referred to as "defocus information").

The condenser lens unit 21, the mask member 22, the separator lens unit 23 and the line sensor unit 24 having such a configuration are arranged in the module frame 25.

The module frame 25 is a member formed in a frame shape, with an attachment portion 25*a* provided on the inner circumference thereof and protruding inwardly. A first attachment portion 25*b* and a second attachment portion 25*c* are formed in a terraced shape on one side of the attachment portion 25*a* that is closer to the imaging device 10. A third attachment portion 25*d* is formed on the side of the attachment portion 25*a* that is opposite to the imaging device 10.

The mask member 22 is attached to the second attachment portion 25*c* of the module frame 25, and the condenser lens unit 21 is attached to the first attachment portion 25*b* from the side of the imaging device 10. The condenser lens unit 21 and the mask member 22 are formed so that when they are attached to the first attachment portion 25*b* and the second attachment portion 25*c*, respectively, the peripheral portions thereof are fitted into the module frame 25, as shown in FIGS. 3 and 6, thereby being positioned with respect to the module frame 25.

On the other hand, from the opposite side to the imaging device 10, the separator lens unit 23 is attached to the third attachment portion 25*d* of the module frame 25. A positioning pin 25*e* and a direction reference pin 25*f*, protruding to the opposite side to the condenser lens unit 21, are provided on the third attachment portion 25*d*. On the other hand, a positioning hole 23*b* and a direction reference hole 23*c*, corresponding to the positioning pin 25*e* and the direction reference pin 25*f*, respectively, are formed on the separator lens unit 23. The positioning pin 25*e* and the positioning hole 23*b* have their diameters determined so that they fit together. On the other hand, the direction reference pin 25*f* and the direction reference hole 23*c* have their diameters determined so that they loosely fit together. That is, the orientation, such as the direction, of the separator lens unit 23 for the attachment to the third attachment portion 25*d* is defined by inserting the positioning hole 23*b* and the direction reference hole 23*c* into the positioning pin 25*e* and the direction reference pin 25*f*, respectively, of the third attachment portion 25*d*, and the separator lens unit 23 is positioned with respect to the third attachment portion 25*d* by fitting together the positioning hole 23*b* and the positioning pin 25*e*. When the separator lens unit 23 is attached with its orientation and position fixed, the lens surfaces of the separator lenses 23*a*, 23*a*, . . . , face toward the condenser lens unit 21 while opposing the mask openings 22*a* and 22*a*.

The condenser lens unit 21, the mask member 22 and the separator lens unit 23 are attached to the module frame 25 while being positioned with respect to the module frame 25. That is, the condenser lens unit 21, the mask member 22 and the separator lens unit 23 are positioned with respect to one another by the module frame 25.

Then, the line sensor unit 24 is attached to the module frame 25 from the back surface side (the opposite side to the condenser lens unit 21) of the separator lens unit 23. The line sensor unit 24 is attached to the module frame 25 in a state where it is positioned so that light which has passed through each separator lens 23*a* is incident upon one line sensor 24*a*.

Therefore, when the condenser lens unit 21, the mask member 22, the separator lens unit 23 and the line sensor unit 24 are attached to the module frame 25, the condenser lenses 21*a*, 21*a*, . . . , the mask member 22, the separator lenses 23*a*, 23*a*, . . . , and the line sensors 24*a*, 24*a*, . . . , are positioned so that light incident upon the condenser lenses 21*a*, 21*a*, . . . , passes through the condenser lenses 21*a*, 21*a*, . . . , to be incident upon the separator lenses 23*a*, 23*a*, . . . , through the mask member 22, and light which has passed through the separator lenses 23*a*, 23*a*, . . . , forms an image on the line sensors 24*a*, 24*a*, . . . .

The imaging device 10 and the phase difference detection unit 20 having such a configuration are bonded to each other. Specifically, the imaging device 10 and the phase difference detection unit 20 are configured such that the opening 31*c* of the package 31 of the imaging device 10 and the condenser lens 21*a* of the phase difference detection unit 20 fit together. That is, the module frame 25 is bonded to the package 31 with the condenser lenses 21*a*, 21*a*, . . . , of the phase difference detection unit 20 fitted into the openings 31*c*, 31*c*, . . . , of the package 31 of the imaging device 10. Thus, the imaging device 10 and the phase difference detection unit 20 can be adhesively bonded together while being positioned with respect to each other. Thus, the condenser lenses 21a, 21a, ..., the separator lenses 23a, 23a, ..., and the line sensors 24a, 24a, ..., are made into a single unit, and are attached to the package 31 as a unit.

Here, the configuration may be such that all the openings 31c, 31c, ..., and all the condenser lenses 21a, 21a, ..., are fitted together. Alternatively, the configuration may be such that only some of the openings 31c, 31c, ..., are fitted together with the corresponding condenser lenses 21a, 21a, ..., with the remaining openings 31c, 31c, ..., loosely fitted together with the corresponding condenser lenses 21a, 21a, .... In the latter case, it is preferred that the condenser lens 21a and the opening 31c which are closest to the center of the imaging surface are fitted together for realizing the positioning in the imaging surface, and the condenser lens 21a and the opening 31c which are farthest away from the center of the imaging surface are fitted together for realizing the positioning around the condenser lens 21a and the opening 31c at the center of the imaging surface (i.e., positioning of the rotation angle).

As a result of bonding together the imaging device 10 and the phase difference detection unit 20 as described above, the condenser lens 21a, a pair of mask openings 22a and 22a of the mask member 22, the separator lens 23a and the line sensor 24a are arranged for each through hole 14c of the exit-side mask 14b on the back surface side of the imaging device 10.

Thus, light which has passed through the imaging device 10 can easily reach the back surface side of the package 31 by providing the openings 31c, 31c, ..., in the bottom plate 31a of the package 31 accommodating the imaging device 10 which is configured so as to allow light to pass therethrough, and it is possible to easily realize a configuration where light which has passed through the imaging device 10 is received by the phase difference detection unit 20 by arranging the phase difference detection unit 20 on the back surface side of the package 31.

Although the openings 31c, 31c, ..., formed in the bottom plate 31a of the package 31 may employ any configuration as long as light which has passed through the imaging device 10 is passed to the back surface side of the package 31, light which has passed through the imaging device 10 can reach, without being attenuated, the back surface side of the package 31 by forming the openings 31c, 31c, ..., which are through holes.

By fitting the condenser lenses 21a, 21a, ..., into the openings 31c, 31c, ..., it is possible to position the phase difference detection unit 20 with respect to the imaging device 10 by using the openings 31c, 31c, .... Note that in a case where the condenser lenses 21a, 21a, ..., are not provided, the phase difference detection unit 20 can similarly be positioned with respect to the imaging device 10 by employing a configuration such that the separator lenses 23a, 23a, ..., are fitted into the openings 31c, 31c, ....

Moreover, since the condenser lenses 21a, 21a, ..., can be arranged close to the substrate 11a while penetrating the bottom plate 31a of the package 31, the imaging unit 1 can be made compact.

Figure 7:
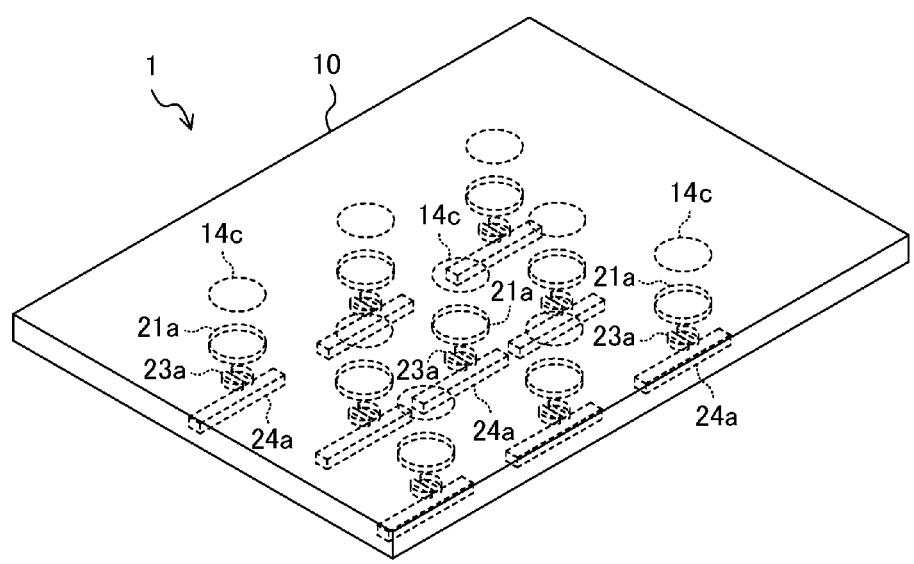
FIG. 7 is a perspective view of an imaging unit.

Three through holes 14c are formed in the exit-side mask 14b of the imaging device 10, with three sets of the condenser lens 21a, the separator lens 23a and the line sensor 24a provided corresponding to the through holes 14c, 14c and 14c, but the present invention is not limited to this. These numbers are not limited to three, but may be set to any other number. For example, there may be nine through holes 14c, 14c, ..., and nine sets of the condenser lens 21a, the separator lens 23a and the line sensor 24a, as shown in FIG. 7.

An operation of the imaging unit 1 having such a configuration will now be described.

When light from the object is incident upon the imaging unit 1, the light passes through the cover glass 33 to be incident upon the glass substrate 19. The light passes through the glass substrate 19 to be incident upon the back surface of the substrate 11a of the imaging device 10. At this point, each portion of the light passes through one of the color filters 15r, 15g and 15b so that only light of the color corresponding to the color filter 15 is incident upon the substrate 11a. The light incident upon the substrate 11a passes through the substrate 11a to reach the light-receiving portions 11b, 11b, ..., on the front surface of the substrate 11a. Since the incident-side mask 14a is provided on the front surface of the substrate 11a, no light is incident upon the vertical register 12 or the transfer path 13, and light is incident only upon the light-receiving portions 11b, 11b, .... Each light-receiving portion 11b absorbs light to generate electrical charge. Here, not all of the light incident upon the light-receiving portion 11b is absorbed by the light-receiving portion 11b, but a portion thereof passes through the light-receiving portion 11b. However, since the exit-side mask 14b is provided at a position reached by light passing through the light-receiving portion 11b, light which has passed through the light-receiving portion 11b is reflected by the exit-side mask 14b, and the light is again incident upon the light-receiving portion 11b. The electrical charge generated by each light-receiving portion 11b is sent to the amplifier via the vertical register 12 and the transfer path 13, and is output as an electric signal. Thus, the light-receiving portions 11b convert light into an electric signal across the entire imaging surface of the imaging device 10, and thus the imaging device 10 converts an object image formed on the imaging surface into an electric signal for producing an image signal.

Note however that in the through holes 14c, 14c, ..., of the exit-side mask 14b, light which has passed through the light-receiving portions 11b, 11b, ..., of the imaging device 10 exits to the back surface side of the imaging device 10. Then, light which has passed through the imaging device 10 is incident upon the condenser lenses 21a, 21a, ..., which are fitted into the openings 31c, 31c, ..., of the package 31. Light which has been condensed together by passing through the condenser lenses 21a is divided into two light beams while passing through each pair of mask openings 22a and 22a formed in the mask member 22, and the divided light beams are incident upon the separator lens 23a. The light, which has been split in pupil-division, passes through the separator lens 23a to form an identical object image at two locations on the line sensor 24a. The line sensor 24a produces and outputs an electric signal from the object image through photoelectric conversion.

Then, how electric signals obtained by conversion by the imaging device 10 are processed in the body microcomputer 50 will be described.

The electric signal output from the imaging device 10 is input to the body microcomputer 50 via the imaging unit control section 52. Then, the body microcomputer 50 obtains the position information of each light-receiving portion 11b and output data corresponding to the amount of light received by the light-receiving portion 11b from the entire imaging surface of the imaging device 10, thereby obtaining the object image formed on the imaging surface as an electric signal.

Here, in the light-receiving portions 11b, 11b, ..., even when the same amount of light is received, the amounts of accumulated electrical charge differ among different wavelengths of light. Therefore, the outputs from the light-receiving portions 11b, 11b, ..., of the imaging device 10 are each corrected according to the kind of the color filter 15r, 15g, 15b provided therefor. For example, the amount of correction is determined for each pixel so that when the R pixel 11b provided with the red color filter 15r, the G pixel 11b provided with the green color filter 15g, and the B pixel 11b provided with the blue color filter 15b receive the same amount of different colors of light corresponding to the color of each color filter, the output from the R pixel 11b, the output from the G pixel 11b and the output from the B pixel 11b are at the same level.

In addition, in the present embodiment, with the provision of the through holes 14c, 14c, . . . , of the exit-side mask 14b, the amount of received light is smaller in areas of the imaging device 10 corresponding to the through holes 14c, 14c, . . . , as compared with that in other areas thereof. As a result, portions of the image corresponding to the through holes 14c, 14c, . . . , may not be captured appropriately (e.g., a shooting image might be dark), if output data from the pixels 11b, 11b, . . . , provided in areas corresponding to the through holes 14c, 14c, . . . , are subjected to the same image processing as that for output data from the pixels 11b, 11b, . . . , provided in other areas. Therefore, outputs from the pixels 11b in the through holes 14c, 14c, . . . , are corrected so as to eliminate the influence of the through holes 14c, 14c, . . . , (e.g., by amplifying the outputs from the pixels 11b in the through holes 14c, 14c, . . . ).

The decrease in output also differs depending on the wavelength of the light. Specifically, as the wavelength is longer, the transmittance of the substrate 11a is higher, and the decrease in output due to the through hole 14c is greater. Therefore, the decrease in output due to the through hole 14c differs depending on the kind of the color filter 15r, 15g, 15b. In view of this, the amount of correction to be made for each pixel 11b corresponding to a through hole 14c for eliminating the influence of the through hole 14c is varied depending on the wavelength of light received by the pixel 11b. Specifically, for each pixel 11b corresponding to a through hole 14c, the amount of correction is set larger as the wavelength of light received by the pixel 11b is longer.

Here, the amount of correction for eliminating the difference in the amount of stored electrical charge depending on the color of light received is determined for each pixel 11b as described above, and the correction for eliminating the influence of the through hole 14c is performed in addition to this correction for eliminating the difference in the amount of stored electrical charge depending on the color. That is, the amount of correction for eliminating the influence of the through hole 14c is equal to the difference between the amount of correction for a pixel 11b corresponding to a through hole 14c and the amount of correction for another pixel 11b not corresponding to a through hole 14c but receiving light of the same color as the pixel 11b. In the present embodiment, the amount of correction is varied from color to color based on the relationship shown below. This realizes a stable image output.

$$Rk > Gk > Bk \quad (1)$$

where

Rk: correction amount for R pixel corresponding to through hole 14c—correction amount for R pixel not corresponding to through hole 14c Gk: correction amount for G pixel corresponding to through hole 14c—correction amount for G pixel not corresponding to through hole 14c Bk: correction amount for B pixel corresponding to through hole 14c—correction amount for B pixel not corresponding to through hole 14c That is, since red, having the longest wavelength of the three colors (red, green and blue), has the highest transmittance, the difference in the amount of correction is largest for a red pixel. Since blue, having the shortest wavelength of the three colors, has the lowest transmittance, the difference in the amount of correction is smallest for a blue pixel.

That is, the amount of correction for the output of each pixel 11b of the imaging device 10 is determined based on whether the pixel 11b is located at a position corresponding to a through hole 14c and on the color of the color filter 15 corresponding to the pixel 11b. The amounts of correction are determined, for example, so that the white balance and/or brightness of the image displayed based on the output from a pixel 11b corresponding to a through hole 14c are equal to those of the image displayed based on the output from another pixel 11b not corresponding to a through hole 14c.

After correcting the output data from the light-receiving portions 11b, 11b, . . . , as described above, the body microcomputer 50 produces an image signal containing the position information, the color information and the brightness information for each light-receiving portion, i.e., each pixel 11b, based on the output data. Thus, there is obtained an image signal of the object image formed on the imaging surface of the imaging device 10.

By correcting the outputs from the imaging device 10 as described above, the object image can be captured appropriately even with the imaging device 10 provided with the through holes 14c, 14c, . . . .

On the other hand, the electric signal output from the line sensor unit 24 is also input to the body microcomputer 50. Then, the body microcomputer 50 obtains the interval between two object images formed on the line sensor 24a based on the output from the line sensor unit 24, and can detect the focus state of the object image formed on the imaging device 10 based on the obtained interval. For example, two object images formed on the line sensor 24a are positioned at predetermined reference positions with a predetermined reference interval therebetween when the object images are correctly formed (focused) on the imaging device 10 through the imaging lens. In contrast, when the object image is formed before the imaging device 10 in the optical axis direction (front focus), the interval between the two object images is smaller than the reference interval realized when the object is focused. On the other hand, when the object image is formed behind the imaging device 10 in the optical axis direction (back focus), the interval between the two object images is larger than the reference interval realized when the object is focused. That is, after amplifying the output from the line sensor 24a and then subjecting the output to arithmetic operations in an arithmetic circuit, it is possible to know if the object is in focus or out of focus, if the object is in front focus or in back focus, and the Df amount.

—Description of Operation of Camera—

Figure 8:
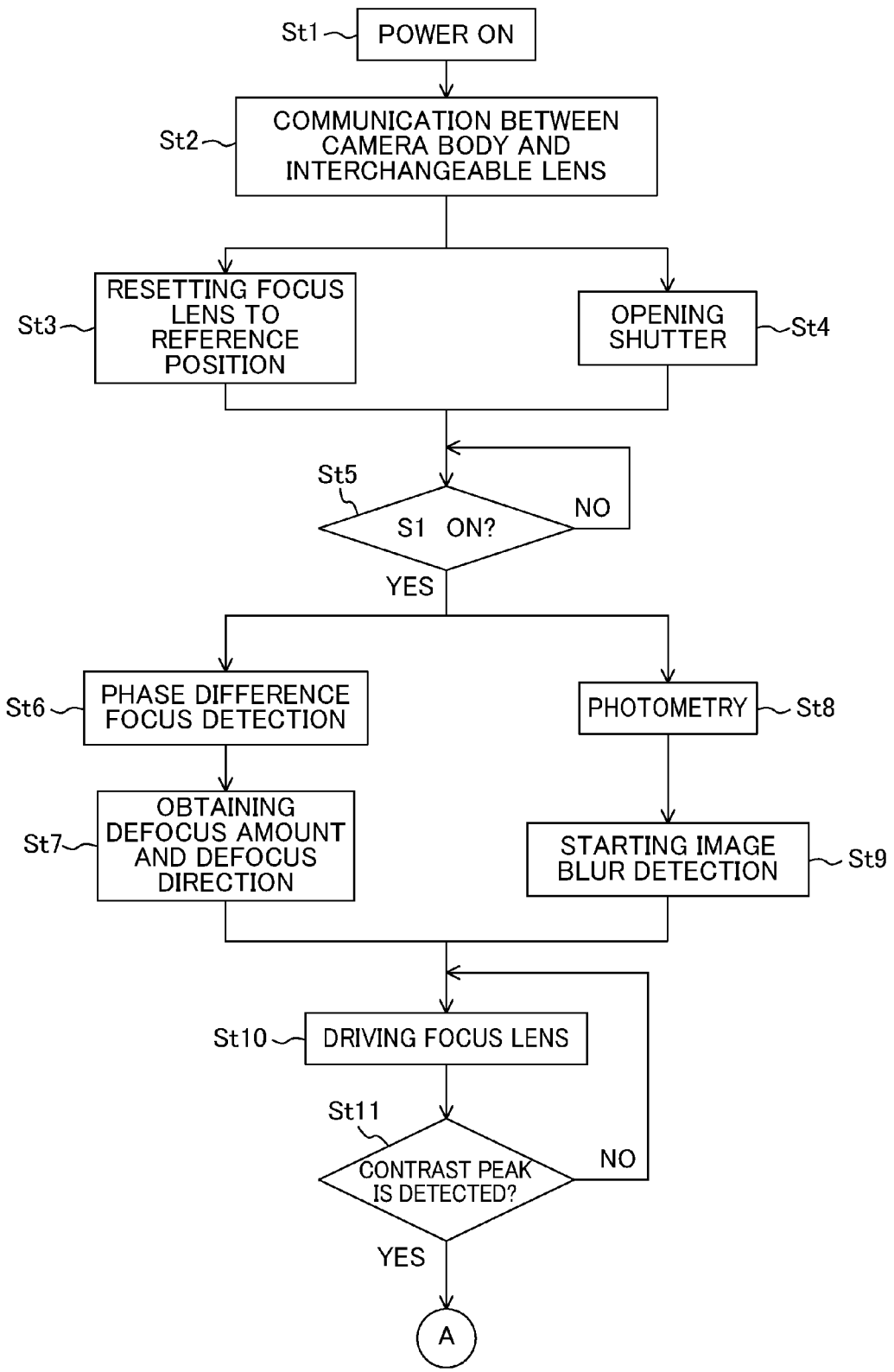
FIG. 8 is a flow chart showing a shooting operation up to when a release button is pressed all the way down.
Figure 9:
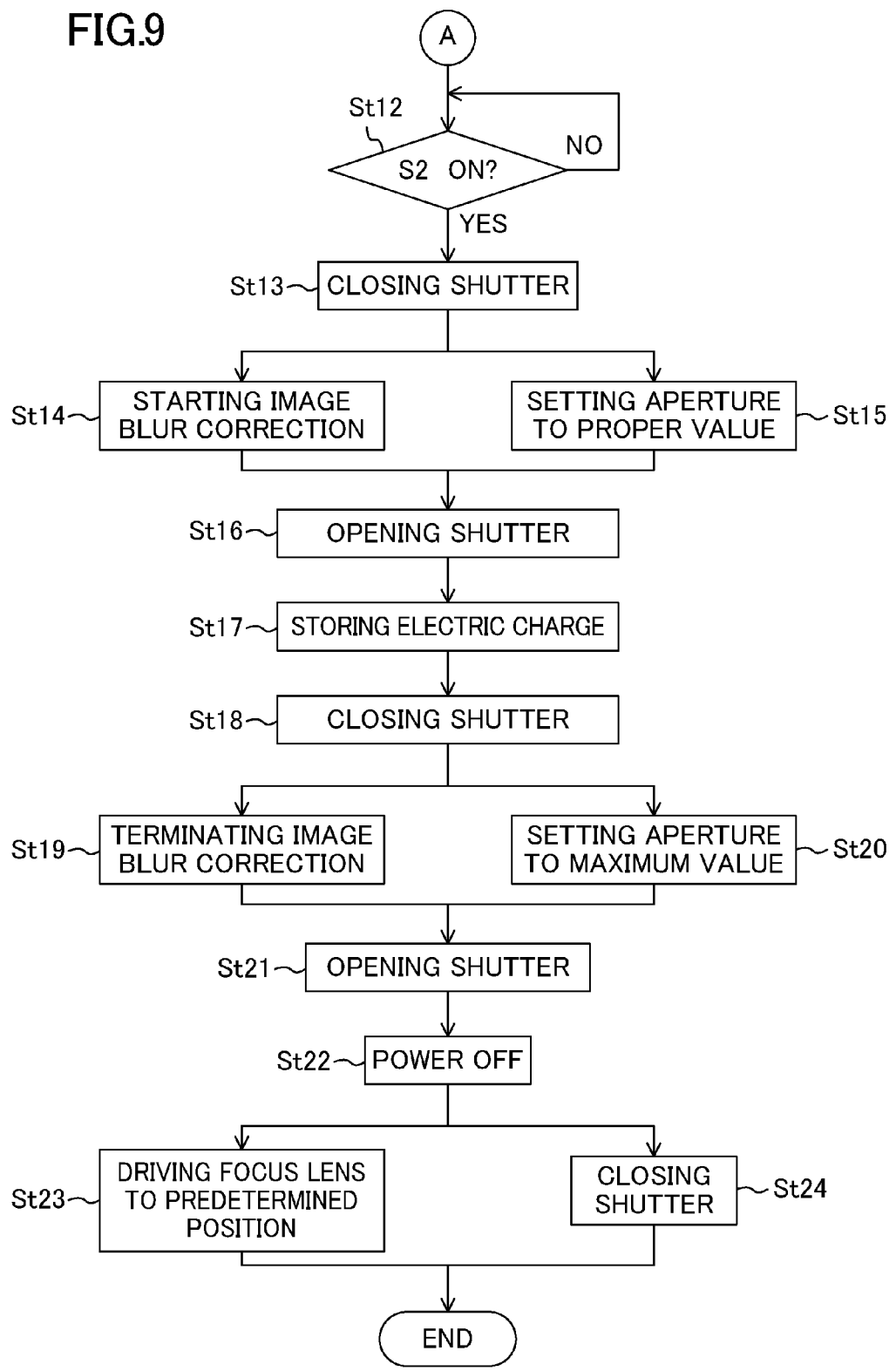
FIG. 9 is a flow chart showing a shooting operation after the release button is pressed all the way down.

An operation of the camera 100 having such a configuration will be described with reference to FIGS. 8 and 9. FIG. 8 is a flow chart showing an operation of the camera 100 up to when a release button is pressed all the way down, and FIG. 9 is a flow chart showing an operation of the camera 100 after the release button is pressed all the way down.

Operations to be described below are controlled primarily by the body microcomputer 50.

First, when the power switch 40a is turned ON (step St1), communications are made between the camera body 4 and the interchangeable lens 7 (step St2). Specifically, the power is supplied to the body microcomputer 50 and various units in the camera body 4, thus starting up the body microcomputer 50. At the same time, the power is supplied to the lens microcomputer 80 and various units in the interchangeable lens 7 via the electric segments 41*a* and 71*a,* thus starting up the lens microcomputer 80. The body microcomputer 50 and the lens microcomputer 80 are programmed so that information is exchanged therebetween upon start-up. For example, lens information regarding the interchangeable lens 7 is transmitted from the memory section of the lens microcomputer 80 to the body microcomputer 50, and the lens information is stored in the memory section of the body microcomputer 50.

Then, the body microcomputer 50 positions the focus lens group 72 at a predetermined reference position via the lens microcomputer 80 (step St3), and at the same time brings the shutter unit 42 to an open state (step St4). Then, the process proceeds to step St5, where the process stands by until the release button 40*b* is pressed halfway down by the photographer.

Thus, light, which has passed through the interchangeable lens 7 and entered the camera body 4, passes through the shutter unit 42 and further through the IR-cut/OLPF 43 to be incident upon the imaging unit 1. Then, the object image formed on the imaging unit 1 is displayed on the image display section 44, and the photographer can observe an erect image of the object on the image display section 44. Specifically, the body microcomputer 50 reads the electric signal from the imaging device 10 via the imaging unit control section 52 at a predetermined cycle, performs a predetermined image process on the read-out electric signal, and then produces an image signal, based on which the body microcomputer 50 controls the image display control section 55 to display a live-view image on the image display section 44.

A portion of light that has been incident upon the imaging unit 1 passes through the imaging device 10 to be incident upon the phase difference detection unit 20.

Here, when the release button 40*b* is pressed halfway down (i.e., when the 51 switch (not shown) is turned ON) by the photographer (step St5), the body microcomputer 50 amplifies the output from the line sensor 24*a* of the phase difference detection unit 20, and subjects the output to arithmetic operations in an arithmetic circuit to determine whether the object is in focus or out of focus (step St6). Moreover, the body microcomputer 50 obtains defocus information by determining whether the object is in front focus or in back focus and determining the amount of defocus (step St7). Then, the process proceeds to step St10. Here, the phase difference detection unit 20 of the present embodiment includes three sets of the condenser lens 21*a,* the mask openings 22*a* and 22*a,* the separator lens 23*a* and the line sensor 24*a,* i.e., three distance measurement points at which to perform phase difference detection-type focus detection. Then, in a phase difference detection, the focus lens group 72 is driven based on the output from the line sensor 24*a* of a set that corresponds to one of the distance measurement points selected by the photographer.

Alternatively, an automatic optimization algorithm may be programmed in the body microcomputer 50 so that the body microcomputer 50 selects one of the distance measurement points at which the camera and the object are closest to each other to drive the focus lens group 72. In such a case, it is possible to reduce the probability of producing a picture focused on the background of an object.

On the other hand, in parallel to steps St6 and St7, photometry is performed (step St8) and the image blur detection is started (step St9).

That is, in step St8, the amount of light incident upon the imaging device 10 is measured by the imaging device 10. That is, in the present embodiment, the phase difference detection described above is performed by using light that has been incident upon and passed through the imaging device 10, and it is therefore possible to perform photometry using the imaging device 10 in parallel to the phase difference detection.

Specifically, the body microcomputer 50 performs the photometry by receiving the electric signal from the imaging device 10 via the imaging unit control section 52, and measuring the intensity of the object light based on the electric signal. Then, based on the results of the photometry, the body microcomputer 50 determines the shutter speed and the aperture value during exposure corresponding to a shooting mode according to a predetermined algorithm.

Then, when the photometry is completed in step St8, the image blur detection is started in step St9. Note that step St8 and step St9 may be performed in parallel.

Then, the process proceeds to step St10. Note that after step St9, the process may proceed to step St12 instead of step St10.

In the present embodiment, the above focus detection based on the phase difference is performed by using light that has been incident upon and passed through the imaging device 10 as described above. Therefore, the photometry can be performed by using the imaging device 10 in parallel with the focus detection.

In step St10, the body microcomputer 50 drives the focus lens group 72 based on the defocus information obtained in step St7.

Then, the body microcomputer 50 determines whether the contrast peak has been detected (step St11). If the contrast peak has not been detected (NO), the process continues to drive the focus lens group 72 (step St10), and if the contrast peak has been detected (YES), driving the focus lens group 72 is halted and the focus lens group 72 is moved to the position at which the contrast value peaked, and the process proceeds to step St11.

Specifically, the body microcomputer 50 drives the focus lens group 72 at a high speed to a position that is spaced apart in the front or rear direction from the position that is estimated as the focus position based on the amount of defocus calculated in step St7. Then, the body microcomputer 50 detects the contrast peak while driving the focus lens group 72 at a low speed toward the position estimated as the focus position.

When the release button 40*b* is pressed halfway down by the photographer, the shooting image and various information regarding the shooting operation are displayed on the image display section 44, and the photographer can check the various information on the image display section 44.

In step St12, the process stands by until the release button 40*b* is pressed all the way down by photographer (i.e., until the S2 switch (not shown) is turned ON). When the release button 40*b* is pressed all the way down by the photographer, the body microcomputer 50 once brings the shutter unit 42 to a closed state (step St13). While the shutter unit 42 is in a closed state, the electrical charge stored in the light-receiving portions 11*b,* 11*b,* . . . , of the imaging device 10 is transferred in preparation for the exposure to be described later.

Then, the body microcomputer 50 starts correcting the image blur based on communication information between the camera body 4 and the interchangeable lens 7 or information specified by the photographer (step St14). Specifically, the body microcomputer 50 drives the blur correction lens driving section 74*a* in the interchangeable lens 7 based on the information of the blur detection section 56 in the camera body 4. Depending on the intention of the photographer, the photographer can select one of (i) using the blur detection section 84 and the blur correction lens driving section 74*a* in the interchangeable lens 7, (ii) using the blur detection section 56 and the blur correcting unit 45 in the camera body 4, and (iii) using the blur detection section 84 in the interchangeable lens 7 and the blur correcting unit 45 in the camera body 4.

Note that by starting driving the image blur correcting means at a point in time when the release button 40*b* is pressed halfway down, it is possible to reduce the movement of the object to be focused and to more accurately perform AF.

In parallel to the start of the correction of the image blur, the body microcomputer 50 stops down the stop portion 73 via the lens microcomputer 80 to an aperture value as obtained from the results of the photometry in step St8 (step St15).

When the correction of the image blur is started and the stop-down is completed, the body microcomputer 50 brings the shutter unit 42 to an open state based on the shutter speed obtained from the results of the photometry in step St8 (step St16). Thus, by bringing the shutter unit 42 to an open state, light from the object is incident upon the imaging device 10, and the imaging device 10 stores electrical charge for a predetermined amount of time (step St17).

Then, the body microcomputer 50 brings the shutter unit 42 to a closed state based on the shutter speed, and ends the exposure (step St18). After the completion of the exposure, the body microcomputer 50 reads out the image data from the imaging unit 1 via the imaging unit control section 52, and outputs the image data to the image display control section 55 via the image reading/recording section 53, after a predetermined image process. Thus, the shooting image is displayed on the image display section 44. The body microcomputer 50 stores the image data in the image storing section 58 via the image recording control section 54, as necessary.

Then, the body microcomputer 50 ends the image blur correction (step St19) and opens up the stop portion 73 (step St20). Then, the body microcomputer 50 brings the shutter unit 42 to an open state (step St21).

When the reset is complete, the lens microcomputer 80 notifies the body microcomputer 50 of the completion of the reset. The body microcomputer 50 waits for the reset completion information from the lens microcomputer 80 and the completion of a series of post-exposure processes and then ends the shooting sequence after checking the release button 40*b* is not being pressed. Then, the process returns to step St5 and stands by until the release button 40*b* is pressed halfway down.

Note that when the power switch 40*a* is turned OFF (step St22), the body microcomputer 50 moves the focus lens group 72 to a predetermined reference position (step St23) and brings the shutter unit 42 to a closed state (step St24). Then, the body microcomputer 50 and various units in the camera body 4 and the lens microcomputer 80 and various units in the interchangeable lens 7 are shut down.

Thus, in the AF operation of the present embodiment, defocus information is obtained by means of the phase difference detection unit 20, and the focus lens group 72 is driven based on these defocus information. Then, the position of the focus lens group 72 at which the contrast value peaks as calculated based on the output from the imaging device 10 is detected, and the focus lens group 72 is moved to the position. Thus, the defocus information can be detected before driving the focus lens group 72, and it is therefore not necessary to perform the step of tentatively driving the focus lens group 72 as with the conventional contrast detection-type AF, thereby shortening the amount of time for the autofocus process. Since the focal point is determined eventually by contrast detection-type AF, it is possible to directly obtain the contrast peak, and it is possible to realize high-precision focusing ability because various correction arithmetic operations such as the opening back correction (defocusing by the degree of opening of the stop) are not necessary unlike the phase difference detection-type AF. Particularly, it is possible to determine a focal point with a better precision than the conventional phase difference detection-type AF with respect to an object having a repetitive pattern or an object having a very low contrast.

Even though the AF operation of the present embodiment includes a phase difference detection, it obtains defocus information by means of the phase difference detection unit 20 using light which has passed through the imaging device 10, and therefore it is possible to simultaneously perform the photometry by the imaging device 10 and obtain defocus information by means of the phase difference detection unit 20. That is, since the phase difference detection unit 20 obtains defocus information by receiving light which has passed through the imaging device 10, the imaging device 10 is always irradiated with light from the object when obtaining the defocus information. In view of this, the photometry is performed using light passing through the imaging device 10 when autofocusing. Then, it is no longer necessary to separately provide a sensor for the photometry, and it is possible to perform the photometry before the release button 40*b* is pressed all the way down. Therefore, it is possible to shorten the amount of time (hereinafter referred to also as the "release time lag") until the exposure is completed from when the release button 40*b* is pressed all the way down.

Even with a configuration where the photometry is performed before the release button 40*b* is pressed all the way down, the photometry may be performed in parallel with autofocus, thereby preventing the process time after the release button 40*b* is pressed halfway down from becoming long. In this case, it is not necessary to provide a mirror for guiding light from the object to a photometry sensor or a phase difference detection unit.

In a conventional configuration, a portion of light guided to the imaging apparatus from the object is guided by means of a mirror, etc., to a phase difference detection unit provided outside the imaging apparatus. In contrast, light guided to the imaging unit 1 can be used as it is to detect the focus state by means of the phase difference detection unit 20, and it is therefore possible to obtain the defocus information with a high precision.

Note that while the above embodiment employs a so-called hybrid-type AF in which contrast-type AF is performed after phase difference detection, the present invention is not limited to this. For example, the present invention may use phase difference detection-type AF in which AF is performed based on the defocus information obtained by the phase difference detection. Alternatively, the present invention may selectively perform one of the hybrid-type AF, the phase difference detection-type AF, and a contrast detection-type AF for determining a focus based only on the contrast value without performing phase difference detection.

—Advantages of Embodiment 1—

Therefore, according to Embodiment 1, the imaging device 10 is configured so that light can pass therethrough, and the phase difference detection unit 20 is provided for performing phase difference detection-type focus detection by receiving light which has passed through the imaging device 10, wherein the focus adjustment is performed as the body control section 5 controls the imaging device 10, and the focus lens group 72 is driven and controlled based on at least the detection results of the phase difference detection unit 20. Thus, various operations using the imaging device 10 and autofocus using the phase difference detection unit 20 can be performed in parallel, thus shortening the process time.

Even if various operations using the imaging device 10 and autofocus using the phase difference detection unit 20 are not performed in parallel, when light is incident upon the imaging device 10, light is also incident upon the phase difference detection unit 20 with a configuration described above, and therefore the various operations using the imaging device 10 and the autofocus using the phase difference detection unit 20 can easily be switched from one to another by changing the control of the body control section 5. That is, as compared with a conventional configuration where the direction in which light travels from the object is switched between the imaging device and the phase difference detection unit by moving a movable mirror back and forth, it is not necessary to move the movable mirror back and forth, and it is therefore possible to quickly switch the various operations using the imaging device 10 and the autofocus using the phase difference detection unit 20 from one to another, and it is possible to quietly switch the various operations using the imaging device 10 and the autofocus using the phase difference detection unit 20 from one to another because there cannot be a sound caused by moving the movable mirror back and forth.

Thus, it is possible to improve the usability of the camera 100.

Specifically, the imaging device 10 is configured so that light can pass therethrough, and the phase difference detection unit 20 is provided for performing phase difference detection-type focus detection by receiving light which has passed through the imaging device 10, so that AF using the phase difference detection unit 20 as in the phase difference detection-type AF described above and the photometry using the imaging device 10 can be performed in parallel. Thus, it is no longer necessary to perform the photometry after the release button 40*b* is pressed all the way down, thereby reducing the release time lag. Even with a configuration where the photometry is performed before the release button 40*b* is pressed all the way down, the photometry may be performed in parallel with autofocus, thereby preventing the process time after the release button 40*b* is pressed halfway down from becoming long. Moreover, it is not necessary to separately provide a photometry sensor because the photometry is performed by using the imaging device 10. Moreover, it is not necessary to provide a movable mirror for guiding light from the object to the photometry sensor or the phase difference detection unit. Thus, it is possible to reduce the power consumption.

Even with the hybrid-type AF described above, switching from the phase difference detection by the phase difference detection unit 20 to the contrast detection using the imaging device 10 can be made immediately by a control in the body control section 5 without the conventional switching of optical paths using a movable mirror, etc., and it is therefore possible to shorten the amount of time required for the hybrid-type AF. Since there is no need for the movable mirror, there is no noise from the movable mirror, and it is possible to perform the hybrid-type AF quietly.

Moreover, with a conventional configuration in which light traveling toward the imaging device 10 from the object is made to travel toward the phase difference detection unit which is provided in a different place than the back surface side of the imaging device 10 by using a movable mirror, or the like, the precision of the focus adjustment is not high because the optical path during exposure is different from that during the phase difference detection, and due to the placement error of the movable mirror, etc. In the present embodiment, since the phase difference detection-type focus detection can be performed with the same optical path as that during exposure because the phase difference detection unit 20 performs phase difference detection-type focus detection by receiving light which has passed through the imaging device 10, and since there is no member such as a movable mirror that can cause errors, it is possible to obtain the amount of defocus based on the phase difference detection with a high precision.

Also in a case where the imaging device 10 is configured so that light can pass therethrough, the imaging device 10 can be reinforced by bonding the glass substrate 19 to the imaging device 10. That is, if the imaging device 10 is configured so that light can pass therethrough, the imaging device 10 becomes very thin, thus lowering the mechanical strength thereof. In view of this, the imaging device 10 can be reinforced by bonding the glass substrate 19 to the imaging device 10. In the present embodiment, while the glass substrate 19 is bonded to the back surface of the substrate 11*a* in the back side-illuminated imaging device 10, the glass substrate 19 is optically transparent and can allow light to pass therethrough, and it is therefore possible to prevent the glass substrate 19 from hindering light from being incident upon the imaging device 10. That is, by using the glass substrate 19, the imaging device 10 can be reinforced without influencing the entrance or exit of light to/from the imaging device 10.

—Variation 1—

Figure 10:
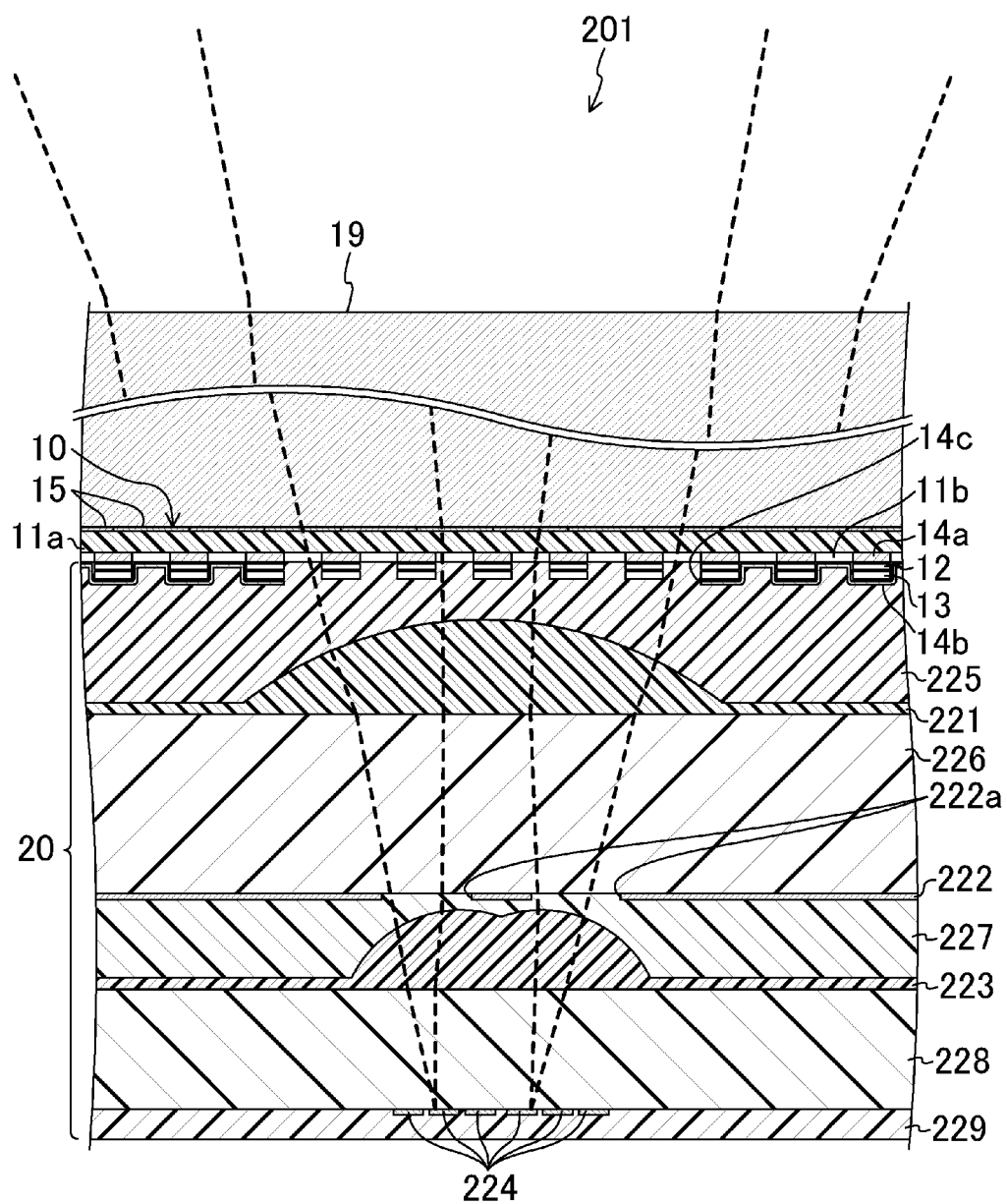
FIG. 10 is a cross-sectional view of an imaging unit according to Variation 1.

A variation of the present embodiment will now be described. FIG. 10 is a cross-sectional view of an imaging unit 210 according to Variation 1.

While the imaging unit 1 is formed by bonding the imaging device 10 and the phase difference detection unit 20 together via the package 31, an imaging unit 201 of Variation 1 is obtained by producing these components by a semiconductor process. The basic configurations of the imaging device 10 and the glass substrate 19 of the imaging unit 201 are similar to those of the imaging unit 1. Note however that the protection layer 18 is absent on the front surface of the substrate 11*a* of the imaging device 10 and, instead, a first low-refractive index layer 225, a condenser lens layer 221, a second low-refractive index layer 226, a third low-refractive index layer 227, a separator lens layer 223, a fourth low-refractive index layer 228 and a protection layer 229 are layered in this order from the front surface of the substrate 11*a*.

The first, second, third and fourth low-refractive index layers 225, 226, 227 and 228 are formed by a transparent material having a relatively low refractive index. On the other hand, the condenser lens layer 221 and the separator lens layer 223 are formed by a transparent material having a relatively high refractive index. Note that the first, second, third and fourth low-refractive index layers 225, 226, 227 and 228 may be of the same material or different materials. Similarly, the condenser lens layer 221 and the separator lens layer 223 may be of the same material or different materials.

A portion of the junction surface of the first low-refractive index layer 225 with the condenser lens layer 221 corresponding to the through hole 14*c* of the exit-side mask 14*b* provided on the substrate 11*a* is depressed in a concave shape toward the substrate 11*a*. On the other hand, a portion of the junction surface of the condenser lens layer 221 with the first low-refractive index layer 225 corresponding to the through hole 14*c* is protruding in a convex shape toward the substrate 11*a*. That is, a portion of the junction surface of the first low-refractive index layer 225 with the condenser lens layer 221 corresponding to the through hole 14*c* forms a lens surface, and the condenser lens layer 221 functions as a condenser lens.

A mask member 222 is provided at the junction surface between the second low-refractive index layer 226 and the third low-refractive index layer 227. The mask member 222 includes two mask openings 222*a* and 222*a* at positions corresponding to the through hole 14*c*.

Moreover, a portion of the junction surface of the third low-refractive index layer 227 with the separator lens layer 223 corresponding to the through hole 14c is depressed in a concave shape toward the substrate 11a. Specifically, the concave-shaped portion has a shape obtained by placing two concave surfaces next to each other. On the other hand, a portion of the junction surface of the separator lens layer 223 with the third low-refractive index layer 227 corresponding to the through hole 14c is protruding in a convex shape toward the substrate 11a in conformity with the third low-refractive index layer 227. Specifically, this convex-shaped portion has a shape obtained by placing two convex surfaces next to each other. That is, a portion of the junction surface between the third low-refractive index layer 227 and the separator lens layer 223 corresponding to the through hole 14c forms two lens surfaces, and the separator lens layer 223 functions as a separator lens.

Moreover, a line sensor 224 is provided at the junction surface between the fourth low-refractive index layer 228 and the protection layer 229 at positions corresponding to the through hole 14c.

The first low-refractive index layer 225, the condenser lens layer 221, the second low-refractive index layer 226, the third low-refractive index layer 227, the separator lens layer 223, the fourth low-refractive index layer 228 and the protection layer 229 together form a phase difference detection unit 220. The glass substrate 19, the imaging device 10 and the phase difference detection unit 220 may be produced by a semiconductor process as described above.

—Variation 2—

Figure 11:
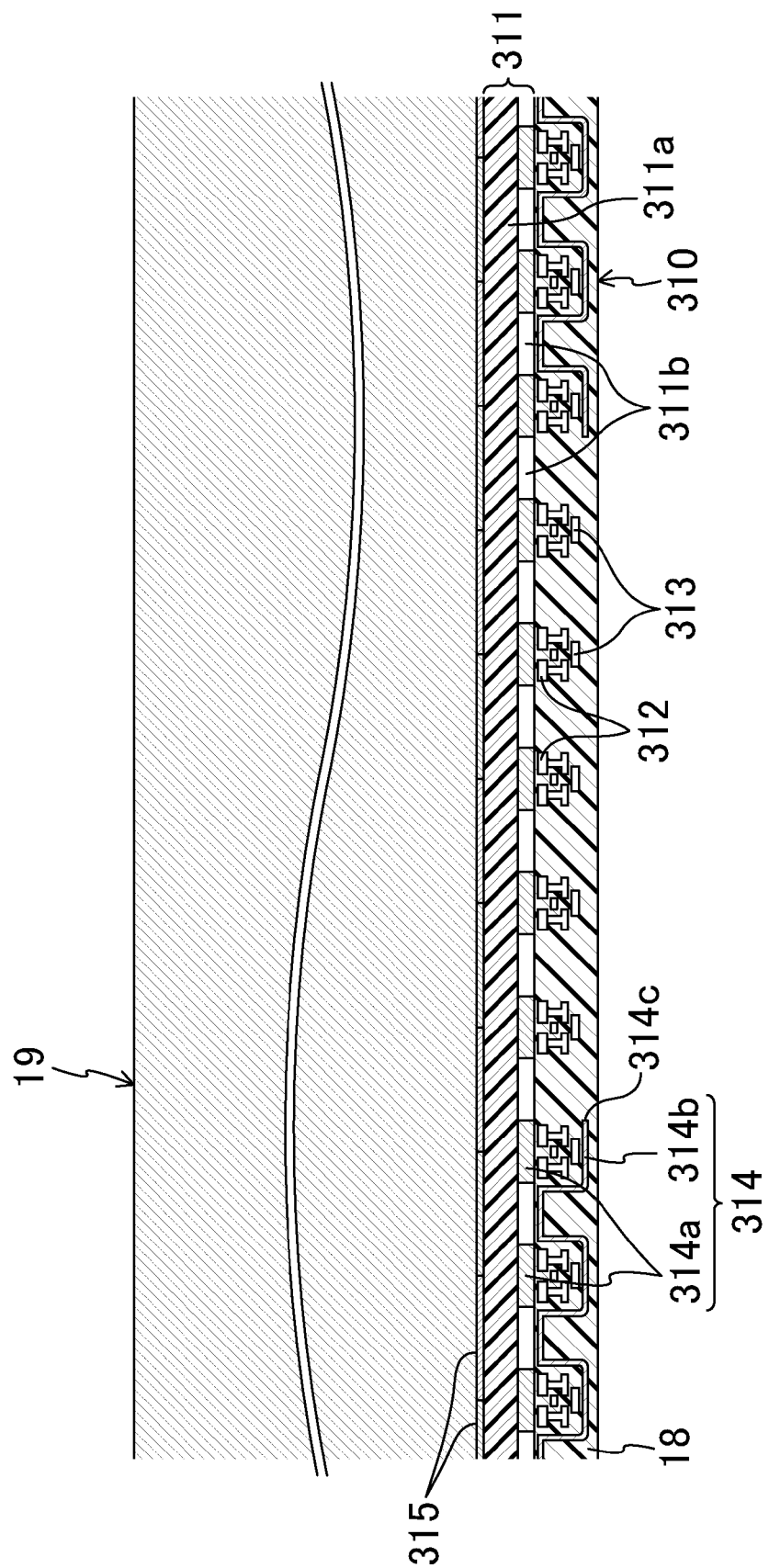
FIG. 11 is a cross-sectional view of an imaging device according to Variation 2.

Next, an imaging device 310 according to Variation 2 will be described with reference to FIG. 11. FIG. 11 is a cross-sectional view of the imaging device 310.

The imaging device 310 is a CMOS image sensor, unlike the imaging device 10 which is a CCD image sensor. Specifically, the imaging device 310 includes a photoelectric conversion section 311 formed by a semiconductor material, a transistor 312, a signal line 313, a mask 314, and a color filter 315.

The photoelectric conversion section 311 includes a substrate 311a, and light-receiving portions 311b, 311b, . . . , each formed by a photodiode. The transistor 312 is provided for each light-receiving portion 311b. The electrical charge stored in the light-receiving portion 311b is amplified through the transistor 312 and is output to the outside through the signal line 313.

The mask 314 is formed by an incident-side mask 314a and an exit-side mask 314b, as is the mask 14. The incident-side mask 314a is provided adjacent to the light-receiving portion 311b, and prevents light from being incident upon the transistor 312 and the signal line 313. The exit-side mask 314b includes a plurality of through holes 314c for allowing light which has passed through the light-receiving portion 311b to exit to the back surface side of the imaging device 310.

The color filter 315 has a similar configuration to that of the color filter 15.

Since the amplification factor of the transistor 312 can be set for each light-receiving portion 311b in a CMOS image sensor, the amplification factor of each transistor 312 may be determined depending on whether the light-receiving portion 311b is located at a position corresponding to the through hole 314c and based on the color of the color filter 315 corresponding to the light-receiving portion 311b so that it is possible to prevent portions of an image corresponding to the through holes 314c, 314c, . . . , from being shot inappropriately.

—Variation 3—

Figure 12:
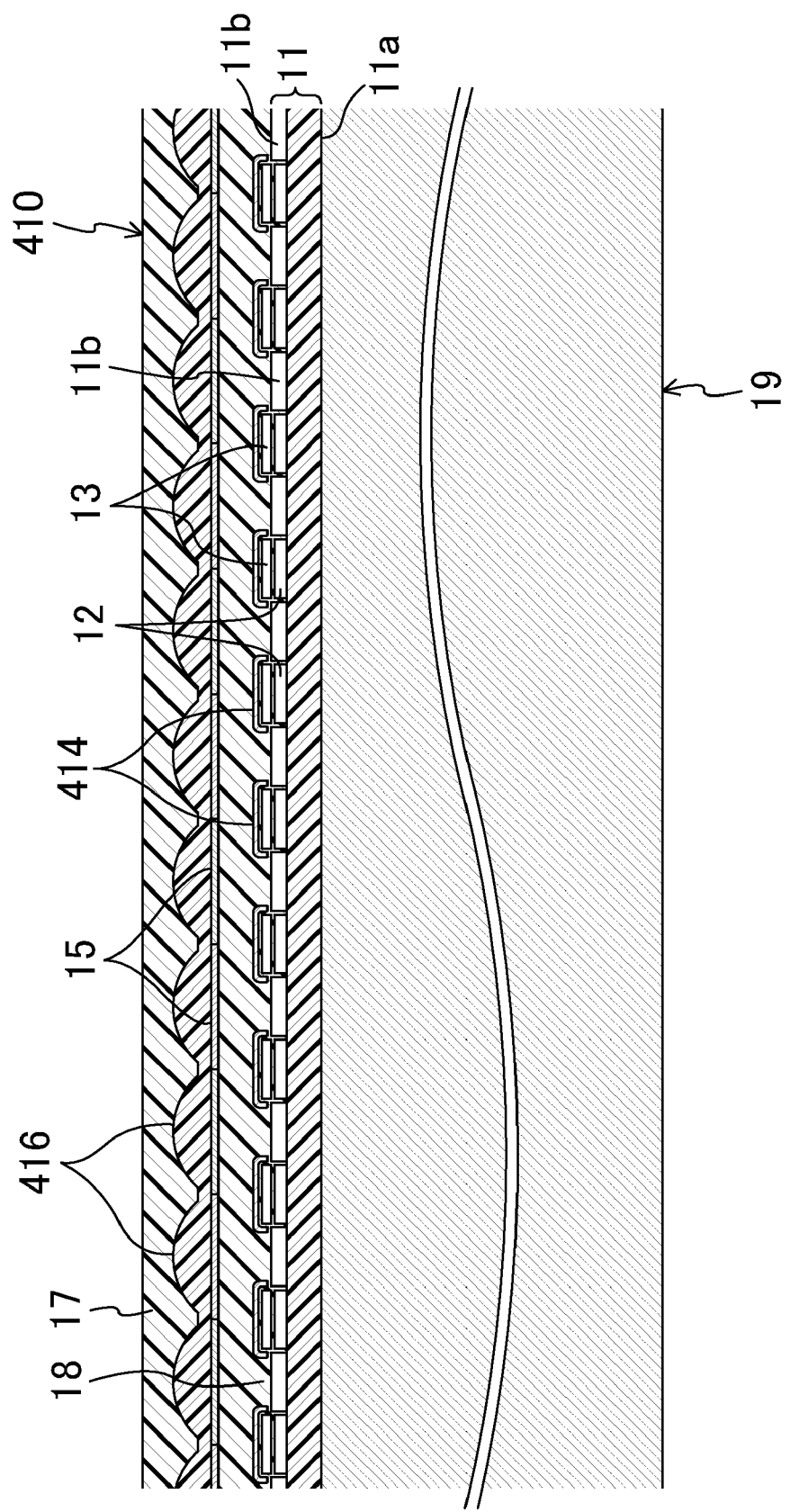
FIG. 12 is a cross-sectional view of an imaging device according to Variation 3.
Figure 13:
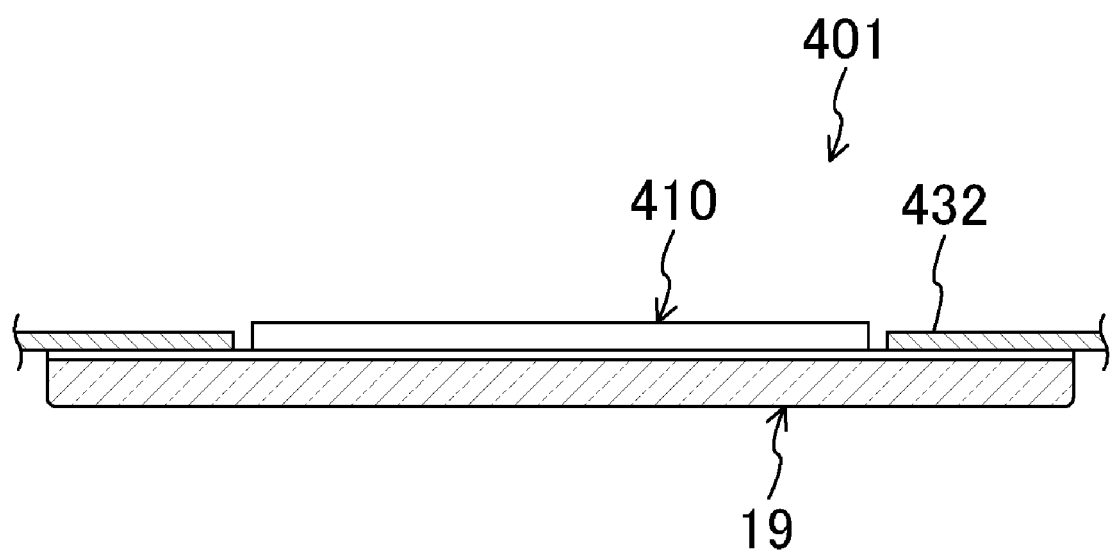
FIG. 13 is a cross-sectional view showing a junction between an imaging device and a package according to Variation 3.

Now, an imaging unit 401 according to Variation 3 will be described with reference to FIGS. 12 and 13. FIG. 12 is a cross-sectional view of the imaging device 410 of the imaging unit 401, and FIG. 13 is a cross-sectional view showing how the imaging device 410 is attached to a circuit substrate 432.

The imaging unit 401 differs from the imaging unit 1 in that light from the object is incident upon the front surface, rather than the back surface, of the substrate of the imaging device. Like elements to those of the imaging unit 1 will be denoted by like reference numerals and will not be described below. The description below will focus on the differences therebetween.

The imaging unit 401 includes the imaging device 410 for converting an object image into an electric signal, the glass substrate 19 bonded to the imaging device 410, a package for holding the imaging device 410, and a phase difference detection unit for performing phase difference detection-type focus detection. The package and the phase difference detection unit have a similar configuration to that of the imaging unit 1 and are not shown in the figure.

The imaging device 410 is a back side-illuminated interline CCD image sensor, and includes the photoelectric conversion section 11 formed by a semiconductor material, the vertical register 12, the transfer path 13, a mask 414, the color filter 15, and a microlens 416, as shown in FIG. 12.

The light-receiving portions 11b, 11b, . . . , are each provided in one of minute square pixel regions arranged in a matrix pattern on the front surface of the substrate 11a. The vertical register 12 is provided adjacent to each light-receiving portion 11b on the front surface of the substrate 11a. Moreover, the transfer path 13 is provided so as to overlap the vertical register 12. The mask 414 is provided so as to cover the vertical register 12 and the transfer path 13.

Unlike the mask 14 of the imaging unit 1, the mask 414 is provided only on the side on which light from the object is incident. Specifically, the mask 414 is provided so as to cover the vertical register 12 and the transfer path 13 from the side opposite to the substrate 11a. Thus, the mask 414 prevents light from the object side from being incident upon the vertical register 12 and the transfer path 13.

Moreover, the protection layer 18 of an optically transparent resin is provided on the front surface of the substrate 11a so as to cover the light-receiving portion 11b, the vertical register 12, the transfer path 13 and the mask 414.

The color filter 15 is layered on the front surface of the protection layer 18 (i.e., the surface of the protection layer 18 that is opposite to the substrate 11a). The color filter 15 is a color filter containing a dye-based or pigment-based coloring matter.

The microlens 416 is formed by an optically transparent resin for condensing light to be incident upon the light-receiving portion 11b, and is layered on the color filter 15. Specifically, the microlens 416 is provided for each light-receiving portion 11b, i.e., for each color filter 15, and is a convex lens protruding in a convex shape toward the object side (i.e., the side opposite to the substrate 11a). With the microlens 416, the light-receiving portion 11b can be irradiated efficiently.

Moreover, a protection layer 17 of an optically transparent resin is layered on the front surface (the convex surface) of the microlens 416.

The glass substrate 19 is anodically-bonded to the back surface of the substrate 11a.

In the imaging device 10 having such a configuration, light which has been condensed by the microlens 416, 416, . . . , is incident upon color filters 15r, 15g, 15b, and only light of the color corresponding to the color filters 15 pass through the color filters 15 to reach the front surface of the substrate 11*a*. On the substrate 11*a*, only the light-receiving portions 11*b*, 11*b*, . . . , are exposed, with the vertical register 12, the transfer path 13, etc., being covered by the mask 414, and therefore light which has reached the substrate 11*a* is incident only upon the light-receiving portions 11*b*, 11*b*, . . . . Each light-receiving portion 11*b* absorbs light to generate electrical charge. The electrical charge generated by each light-receiving portion 11*b* is sent to the amplifier via the vertical register 12 and the transfer path 13, and is output as an electric signal. Since light of a particular color which has passed through one of the color filters 15*r*, 15*g* and 15*b* is incident upon each of the light-receiving portions 11*b*, 11*b*, . . . , the amount of received light of the color corresponding to the color filter 15 is obtained as an output from the light-receiving portion 11*b*. Thus, the imaging device 410 performs photoelectric conversion by the light-receiving portions 11*b*, 11*b*, . . . , across the entire imaging surface, thereby converting an object image formed on the imaging surface into an electric signal.

On the other hand, a portion of light incident upon the light-receiving portion 11*b* is not absorbed by the light-receiving portion 11*b* but passes through the light-receiving portion 11*b*. Since the substrate 11*a* is very thin (i.e., since it is formed to such a thickness that light passes through the substrate 11*a*), light which has passed through the light-receiving portion 11*b* passes through the substrate 11*a* and then through the glass substrate 19 to exit toward the back surface side of the imaging device 410.

As with the imaging unit 1, a phase difference detection unit is provided on the back surface side of the imaging device 410, and the phase difference detection unit performs phase difference detection-type focus detection by using light which has passed through the imaging device 410.

The imaging device 410 having such a configuration is mounted on the circuit substrate 432 of the package.

Specifically, in the peripheral portion of the substrate 11*a* of the imaging device 410, the light-receiving portion 11*b*, the vertical register 12, the transfer path 13, the mask 414, the color filter 15, the microlens 416, the protection layers 17 and 18, etc., are absent, with an interconnect which enables electrical connection with the transfer path 13, the vertical register 12, etc., exposed thereon. On the other hand, a circuit pattern is provided on the back surface (the surface opposite to the object) of the circuit substrate 432 and located so as to face the interconnect of the substrate 11*a* of the imaging device 410. Then, the peripheral portion of the substrate 11*a* of the imaging device 410 is laid over the circuit substrate 432 from the side opposite to the object, and they are bonded together through thermal fusion, thereby electrically connecting the interconnect of the substrate 11*a* of the imaging device 410 with the circuit pattern of the circuit substrate 432, as shown in FIG. 13.

Therefore, also in a case where the imaging device 410 is configured so that light can pass therethrough, the imaging device 410 can be reinforced by bonding the glass substrate 19 to the imaging device 410. That is, if the imaging device 410 is configured so that light can pass therethrough, the imaging device 410 becomes very thin, thus lowering the mechanical strength thereof In view of this, the imaging device 410 can be reinforced by bonding the glass substrate 19 to the imaging device 410. While the glass substrate 19 is bonded to the back surface of the substrate 11*a* in a configuration where light is allowed to be incident from the front surface of the substrate 11*a*, as opposed to a back side-illuminated configuration, since the glass substrate 19 is optically transparent and allows light to pass therethrough, it is possible to prevent the glass substrate 19 from hindering light from exiting the imaging device 410. That is, by using the glass substrate 19, it is possible to reinforce the imaging device 410 without influencing the exit of light from the imaging device 410.

Other effects and advantages similar to those of the imaging unit 1 will also be obtained.

<<Embodiment 2 of Invention>>

Next, an imaging unit 501 according to Embodiment 2 of the present invention will be described with reference to FIG. 14. FIG. 14 is a cross-sectional view of an imaging device 510 of the imaging unit 501.

The imaging unit 501 of Embodiment 2 differs from Embodiment 1 in that the phase difference detection unit is absent. Like elements to those of Embodiment 1 will be denoted by like reference numerals and will not be described below. The description below will focus on the differences therebetween.

The imaging unit 501 includes the imaging device 510 for converting an object image into an electric signal, and the glass substrate 19 bonded to the imaging device 510.

The configuration of the imaging device 510 is similar to Embodiment 1 except for the configuration of an exit-side mask 514*b*. That is, a mask 514 includes an incident-side mask 514*a* provided on the front surface of the substrate 11*a*, and the exit-side mask 514*b* provided so as to cover the light-receiving portion 11*b*, the vertical register 12 and the transfer path 13 from the side opposite to the substrate 11*a*. The exit-side mask 514*b* is not provided with through holes, and completely covers the light-receiving portion 11*b*, the vertical register 12 and the transfer path 13 from the side opposite to the substrate 11*a*.

In the imaging device 510 having such a configuration, light which has passed through the light-receiving portions 11*b*, 11*b*, . . . , is all reflected by the exit-side mask 514*b* to be again incident upon the light-receiving portions 11*b*, 11*b*, . . . , and the light is not allowed to exit to the back surface side of the imaging device 510.

That is, the imaging device 510 of Embodiment 2 is a back side-illuminated imaging device without phase difference detection. Thus, irrespective of whether or not phase difference detection-type focus detection is performed, it is necessary to allow light to pass through the substrate 11*a* as long as it is a back side-illuminated imaging device. While it is necessary to form the substrate 11*a* to such a thickness that light passes therethrough in a configuration where light is allowed to pass through the substrate 11*a*, it is possible to reinforce the imaging device 510 without influencing the incidence of light upon the imaging device 510 by bonding the glass substrate 19 to the imaging device 510 as described above.

<<Other Embodiments>>

The present invention may have the following configurations for the embodiments above.

For example, the configuration of the imaging device is not limited to the above configuration, but may be any configuration as long as it is a configuration where light passes through the imaging device. The phase difference detection unit is also not limited to the above configuration.

The bonding between the imaging device and the optically transparent substrate may be realized by, for example, forming the imaging device on the optically transparent substrate.

While the above embodiments are directed to a configuration where the imaging unit 1 is provided in a camera, the present invention is not limited to this. For example, the imaging unit 1 may be provided in a video camera.

While the description above has been directed to a configuration where AF is started when the release button 40*b* is pressed halfway down by the photographer (i.e., when the S1 switch is turned ON), AF may be started before the release button 40*b* is pressed halfway down. While the description above has been directed to a configuration where AF is ended when it is determined that a focus has been reached, the process may continue to perform AF even after such determination or may continuously perform AF without making such determination.

In the above embodiment, the substrate 11*a* may be removed completely by polishing, etching, etc. In such a case, the glass substrate 19 may be directly bonded to the light-receiving portion 11*b*. The light-receiving portion 11*b* may be formed directly on the glass substrate 19.

Note that the embodiments described above are essentially preferred embodiments, and are not intended to limit the scope of the present invention, the applications thereof, or the uses thereof.

Industrial Applicability

As described above, the present invention is useful for an imaging unit including an imaging device for performing photoelectric conversion.

Description Of Reference Characters

1, 201, 401, 501 Imaging unit
   10, 310, 410 Imaging device
   11*a* Substrate (semiconductor substrate)
   11*b* Light-receiving portion
   15 Color filter (interference filter)
   20, 220 Phase difference detection unit (phase difference detection section)
   21*a* Condenser lens
   221 Condenser lens layer (condenser lens)
   23*a* Separator lens
   223 Separator lens layer (separator lens)
   24*a*, 224 Line sensor
   31 Package

The invention claimed is:

1. An imaging unit comprising:
an imaging device including a semiconductor substrate and a light-receiving portion provided on the semiconductor substrate configured to photoelectrically convert light received by the light-receiving portion into an electric signal while light is allowed to pass through the imaging device;
an optically transparent substrate bonded to the imaging device, the optically transparent substrate allowing light to pass therethrough; and
a phase difference detection section for performing phase difference detection-type focus detection by receiving light which has passed through the imaging device, wherein the phase difference detection section is provided on a side of the imaging device that is opposite to the optically transparent substrate.

2. The imaging unit of claim 1, wherein
the phase difference detection section includes a separator lens for splitting, in pupil-division, light which has passed through the imaging device, and a sensor for detecting light which has been split by the separator lens.

3. The imaging unit of claim 2, wherein
the phase difference detection section further includes a condenser lens provided closer to the imaging device than the separator lens for condensing light which has passed through a plurality of the light-receiving portions of the imaging device so that the light is incident upon the separator lens.

4. The imaging unit of claim 2, wherein
the phase difference detection section is formed by a semiconductor process on the semiconductor substrate.

5. The imaging unit of claim 2, wherein
the sensor is a line sensor.

6. The imaging unit of claim 1, wherein
the phase difference detection section is provided on a side of the optically transparent substrate that is opposite to the imaging device.

7. The imaging unit of claim 6, wherein
the phase difference detection section includes a separator lens for splitting, in pupil-division, light which has passed through the imaging device, and a sensor for detecting light which has been split by the separator lens.

8. The imaging unit of claim 7, wherein
the phase difference detection section further includes a condenser lens provided closer to the imaging device than the separator lens for condensing light which has passed through the imaging device so that the light is incident upon the separator lens.

9. The imaging unit of claim 1, further comprising:
a package in which the phase difference detection section is arranged, wherein
the imaging device is attached to the package.

10. The imaging unit of claim 1, wherein
the imaging device and the optically transparent substrate are anodically-bonded to each other.

11. The imaging unit of claim 10, wherein
the semiconductor substrate of the imaging device is an Si single crystal, and
the optically transparent substrate is a borosilicate glass substrate.

12. The imaging unit of claim 1, wherein
the semiconductor substrate of the imaging device has a thickness of 5 μm or less.

13. The imaging unit of claim 1, wherein
an electrical connection terminal is provided in a peripheral portion of the semiconductor substrate.

14. The imaging unit of claim 1, wherein
the imaging device is configured so as to receive light which has passed through the optically transparent substrate, and
an interference filter is provided on a surface of the optically transparent substrate that faces the imaging device.

15. The imaging unit of claim 14, wherein
the interference filter is a Bayer arrangement filter which allows each of three primary colors, R, G and B, to pass therethrough by an interference phenomenon.

16. An imaging unit, comprising:
an imaging device including a light-receiving portion configured to photoelectrically convert light received by the light-receiving portion into an electric signal while light is allowed to pass through the imaging device;
an optically transparent substrate bonded to the imaging device and allowing light to pass therethrough; and
a phase difference detection section for performing phase difference detection-type focus detection by receiving light which has passed through the imaging device, wherein the phase difference detection section is provided on a side of the imaging device that is opposite to the optically transparent substrate.

\* \* \* \* \*